(12) United States Patent
Fukunaga et al.

(10) Patent No.: US 10,770,647 B2
(45) Date of Patent: Sep. 8, 2020

(54) ELECTROACOUSTIC CONVERSION FILM WEB, ELECTROACOUSTIC CONVERSION FILM, AND METHOD OF MANUFACTURING AN ELECTROACOUSTIC CONVERSION FILM WEB

(71) Applicant: FUJIFILM Corporation, Tokyo (JP)

(72) Inventors: Akihito Fukunaga, Ashigara-kami-gun (JP); Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/254,192

(22) Filed: Jan. 22, 2019

(65) Prior Publication Data

US 2019/0157543 A1 May 23, 2019

Related U.S. Application Data

(60) Division of application No. 15/808,108, filed on Nov. 9, 2017, now Pat. No. 10,224,477, which is a (Continued)

(30) Foreign Application Priority Data

May 11, 2015 (JP) .................................. 2015-096470

(51) Int. Cl.
*H04R 17/02* (2006.01)
*H01L 41/312* (2013.01)
(Continued)

(52) U.S. Cl.
CPC .............. *H01L 41/312* (2013.01); *B32B 3/04* (2013.01); *B32B 3/30* (2013.01); *B32B 5/022* (2013.01);
(Continued)

(58) Field of Classification Search
CPC ...................... H04R 2217/00–03; H04R 17/02
(Continued)

(56) References Cited

U.S. PATENT DOCUMENTS 7,019,621 B2 * 3/2006 Woodard ................. G08B 3/10
381/190
9,440,259 B2 9/2016 Miyoshi
(Continued)

FOREIGN PATENT DOCUMENTS

JP 57-073512 A 5/1982
JP 2004-356700 A 12/2004
(Continued)

OTHER PUBLICATIONS

International Search Report (PCT/ISA/210) issued in PCT/JP2016/063883, dated Jul. 12, 2016.
(Continued)

*Primary Examiner* — Suhan Ni
(74) *Attorney, Agent, or Firm* — Birch, Stewart, Kolasch & Birch, LLP

(57) ABSTRACT

Provided are an electroacoustic conversion film web, an electroacoustic conversion film, and a method of manufacturing an electroacoustic conversion film web in which costs can be reduced by reducing the number of operations without damage to thin film electrodes, the points of electrode lead-out portions can be freely determined, and thus high productivity can be achieved. A preparation step of preparing an electrode laminated body in which a single thin film electrode and a single protective layer are laminated and a lamination step of laminating the electrode laminated body and an piezoelectric layer are included. A non-adhered portion that is not adhered to the piezoelectric layer is provided in at least one end portion of the thin film electrode
(Continued)

in a case where the electrode laminated body and the piezoelectric layer are laminated in the lamination step.

1 Claim, 5 Drawing Sheets

Related U.S. Application Data continuation of application No. PCT/JP2016/063883, filed on May 10, 2016.

(51) Int. Cl.

| | | |
|---|---|---|
| H01L 41/37 | (2013.01) | |
| H01L 41/047 | (2006.01) | |
| H01L 41/09 | (2006.01) | |
| H01L 41/113 | (2006.01) | |
| H01L 41/18 | (2006.01) | |
| H01L 41/29 | (2013.01) | |
| H01L 41/317 | (2013.01) | |
| H01L 41/338 | (2013.01) | |
| H04R 17/00 | (2006.01) | |
| H04R 31/00 | (2006.01) | |
| H01L 41/257 | (2013.01) | |
| H01L 41/331 | (2013.01) | |
| B32B 3/30 | (2006.01) | |
| B32B 5/02 | (2006.01) | |
| B32B 3/04 | (2006.01) | |
| B32B 27/32 | (2006.01) | |
| B32B 5/26 | (2006.01) | |
| B32B 23/10 | (2006.01) | |
| B32B 7/08 | (2019.01) | |
| B32B 29/02 | (2006.01) | |
| B32B 25/08 | (2006.01) | |
| B32B 27/08 | (2006.01) | |
| B32B 25/12 | (2006.01) | |
| B32B 27/28 | (2006.01) | |
| B32B 7/12 | (2006.01) | |
| B32B 7/02 | (2019.01) | |
| B32B 27/36 | (2006.01) | |
| B32B 5/18 | (2006.01) | |
| B32B 29/00 | (2006.01) | |
| B32B 23/08 | (2006.01) | |
| B32B 7/06 | (2019.01) | |
| B32B 23/04 | (2006.01) | |
| B32B 27/06 | (2006.01) | |
| B32B 27/30 | (2006.01) | |
| B32B 25/14 | (2006.01) | |
| B32B 27/10 | (2006.01) | |
| B32B 5/24 | (2006.01) | |
| B32B 27/12 | (2006.01) | |
| B32B 5/32 | (2006.01) | |
| B32B 37/12 | (2006.01) | |
| B32B 37/14 | (2006.01) | |
| B32B 38/00 | (2006.01) | |
| H01L 41/053 | (2006.01) | |

(52) U.S. Cl.
CPC .............. *B32B 5/18* (2013.01); *B32B 5/245* (2013.01); *B32B 5/26* (2013.01); *B32B 5/32* (2013.01); *B32B 7/02* (2013.01); *B32B 7/06* (2013.01); *B32B 7/08* (2013.01); *B32B 7/12* (2013.01); *B32B 23/04* (2013.01); *B32B 23/048* (2013.01); *B32B 23/08* (2013.01); *B32B 23/10* (2013.01); *B32B 25/08* (2013.01); *B32B 25/12* (2013.01); *B32B 25/14* (2013.01); *B32B 27/065* (2013.01); *B32B 27/08* (2013.01); *B32B 27/10* (2013.01); *B32B 27/12* (2013.01); *B32B 27/281* (2013.01); *B32B 27/285* (2013.01); *B32B 27/286* (2013.01); *B32B 27/30* (2013.01); *B32B 27/302* (2013.01); *B32B 27/32* (2013.01); *B32B 27/325* (2013.01); *B32B 27/36* (2013.01); *B32B 27/365* (2013.01); *B32B 29/005* (2013.01); *B32B 29/007* (2013.01); *B32B 29/02* (2013.01); *B32B 37/12* (2013.01); *B32B 37/14* (2013.01); *B32B 38/0004* (2013.01); *H01L 41/047* (2013.01); *H01L 41/0533* (2013.01); *H01L 41/09* (2013.01); *H01L 41/0973* (2013.01); *H01L 41/113* (2013.01); *H01L 41/1138* (2013.01); *H01L 41/18* (2013.01); *H01L 41/183* (2013.01); *H01L 41/257* (2013.01); *H01L 41/29* (2013.01); *H01L 41/317* (2013.01); *H01L 41/331* (2013.01); *H01L 41/338* (2013.01); *H01L 41/37* (2013.01); *H04R 17/00* (2013.01); *H04R 31/00* (2013.01); *B32B 2255/00* (2013.01); *B32B 2255/10* (2013.01); *B32B 2255/20* (2013.01); *B32B 2255/205* (2013.01); *B32B 2255/24* (2013.01); *B32B 2255/26* (2013.01); *B32B 2262/0284* (2013.01); *B32B 2262/04* (2013.01); *B32B 2262/10* (2013.01); *B32B 2262/106* (2013.01); *B32B 2266/02* (2013.01); *B32B 2266/0264* (2013.01); *B32B 2266/0278* (2013.01); *B32B 2305/72* (2013.01); *B32B 2307/10* (2013.01); *B32B 2307/204* (2013.01); *B32B 2307/50* (2013.01); *B32B 2307/51* (2013.01); *B32B 2307/54* (2013.01); *B32B 2307/546* (2013.01); *B32B 2307/718* (2013.01); *B32B 2307/732* (2013.01); *B32B 2307/748* (2013.01); *B32B 2309/105* (2013.01); *B32B 2429/00* (2013.01); *B32B 2457/202* (2013.01); *B32B 2457/206* (2013.01)

(58) Field of Classification Search
USPC .................................. 381/190, 173
See application file for complete search history.

(56) References Cited

U.S. PATENT DOCUMENTS

| | | |
|---|---|---|
| 9,635,467 B2 | 4/2017 | Miyoshi et al. |
| 9,723,412 B2 | 8/2017 | Miyoshi |
| 9,973,858 B2 | 5/2018 | Miyoshi |
| 2016/0014527 A1 | 1/2016 | Miyoshi et al. |

FOREIGN PATENT DOCUMENTS

| | | |
|---|---|---|
| JP | 2008-294493 A | 12/2008 |
| JP | 2014-014063 A | 1/2014 |
| JP | 2014-209724 A | 11/2014 |

OTHER PUBLICATIONS

Written Opinion (PCT/ISA/237) issued in PCT/JP2016/063883, dated Jul. 12, 2016.

\* cited by examiner

ELECTROACOUSTIC CONVERSION FILM WEB, ELECTROACOUSTIC CONVERSION FILM, AND METHOD OF MANUFACTURING AN ELECTROACOUSTIC CONVERSION FILM WEB

CROSS-REFERENCE TO RELATED APPLICATIONS

This application is a Divisional of copending application Ser. No. 15/808,108 filed on Nov. 9, 2017, which is a Continuation of PCT International Application No. PCT/JP2016/063883 filed on May 10, 2016, which claims priority under 35 U.S.C. § 119(a) to Japanese Patent Application No. 2015-096470 filed on May 11, 2015. The above application is hereby expressly incorporated by reference, in its entirety, into the present application.

BACKGROUND OF THE INVENTION

1. Field of the Invention

The present invention relates to an electroacoustic conversion film web which is processed to be used as an electroacoustic conversion film used for an acoustic device such as a speaker or a microphone, an electroacoustic conversion film, and manufacturing methods thereof.

2. Description of the Related Art

In response to thinning of displays such as liquid crystal displays and organic electroluminescence (EL) displays, speakers used in such thin displays are also required to be lighter and thinner. As such a lightweight and thin speaker, it is considered to adopt a sheet-like piezoelectric film having a property that stretches and contracts in response to an applied voltage.

For example, in JP2008-294493A, it is described that a piezoelectric film obtained by performing polarization processing with respect to a monoaxially stretched film of polyvinylidene fluoride (PVDF) at a high voltage is used.

In order to adopt the piezoelectric film as a speaker, it is necessary that a stretching and contracting movement along a film surface is converted into a vibration of the film surface. This conversion from the stretching and contracting movement into the vibration is attained by holding the periphery of the piezoelectric film in a bent state, and thus the piezoelectric film is able to function as a speaker.

Here, the present applicants suggested, as a piezoelectric film capable of being used for a thin speaker, an electroacoustic conversion film including a polymer composite piezoelectric body in which piezoelectric body particles are dispersed in a viscoelastic matrix formed of a polymer material having viscoelasticity at a normal temperature, thin film electrodes formed on both surfaces of the polymer composite piezoelectric body, and protective layers formed on the surfaces of the thin film electrodes, which is disclosed in JP2014-14063A.

In such a piezoelectric film, two thin film electrodes forming an electrode pair for applying a voltage to a piezoelectric layer are formed on both surfaces of the piezoelectric layer that stretches and contracts in response to an applied voltage, and wires need to be connected to the two thin film electrodes.

On the other hand, the piezoelectric film used as a thin speaker also needs to be thinner from viewpoints of not only thinning of the speaker but also responsiveness and widening of a reproducible band. However, in a thin electrode layer such as a vapor-deposited film, it is difficult to connect wires by soldering or the like.

In addition, connection of wires to the thin film electrodes needs to be performed while insulation between the thin film electrodes on both surfaces of the piezoelectric layer is ensured. However, the connection of wires is not easy because the thickness of the piezoelectric layer is as thin as approximately tens of μm.

Regarding this, in JP2014-209724A, the applicant proposed an electroacoustic conversion film having a configuration in which thin film electrodes and protective layers have electrode lead-out portions protruding in a convex shape, in the outer portions of a piezoelectric layer in a surface direction. With this configuration, electrodes can be drawn from the thin film electrodes and connection of wires by soldering can be easily performed. Furthermore, drawing of the electrodes can be performed while insulation between the thin film electrodes on both surfaces is ensured.

SUMMARY OF THE INVENTION

In JP2014-209724A, as a method of preparing the electroacoustic conversion film having a configuration in which the thin film electrodes and the protective layers have the electrode lead-out portions protruding in a convex shape, in the outer portions of the piezoelectric layer in the surface direction, a method of providing the electrode lead-out portions protruding in a convex shape by entirely laminating the piezoelectric layer, the thin film electrodes, and the protective layers, rubbing the piezoelectric layer with a cotton swab or the like impregnated with a solvent, and dissolving and removing a portion of the piezoelectric layer is described.

However, in the method of laminating the piezoelectric layer, the thin film electrodes, and the protective layers and dissolving and removing the portion of the piezoelectric layer that is to become the electrode lead-out portion, there is concern that the thin film electrodes may be damaged, for example, the thin film electrodes may be dissolved. In addition, there are problems that the number of operations increases, the investment in facilities increases, and costs increase.

In addition, since the electrode lead-out portion is formed in a shape protruding in a convex shape, it is necessary that the position of the electrode lead-out portion is determined in advance in a case where an electroacoustic conversion film is prepared, and the position of the electrode lead-out portion cannot be changed after the preparation. Therefore, in a case where various shapes of electroacoustic conversion films in which the positions, shapes, and the like of electrode lead-out portions vary are prepared, it is necessary that preparation conditions in a step of forming the electrode lead-out portion are changed for each of the electroacoustic conversion films, and there is a problem that productivity cannot be increased.

An object of the present invention is to solve such a problem of the related art, and is to provide an electroacoustic conversion film web, an electroacoustic conversion film, a manufacturing method of an electroacoustic conversion film web, and a manufacturing method of an electroacoustic conversion film, in which costs can be reduced by reducing the number of operations without damage to thin film electrodes, the points of electrode lead-out portions can be freely determined, and thus high productivity can be achieved.

In order to attain the object, the present inventors found that by providing a preparation step of preparing an electrode laminated body in which a single thin film electrode and a single protective layer are laminated and a lamination step of laminating the electrode laminated body and an piezoelectric layer, and providing a non-adhered portion that is not adhered to the piezoelectric layer, in at least one end portion of the thin film electrode in a case where the electrode laminated body and the piezoelectric layer are laminated in the lamination step, the object can be attained, and completed the present invention.

That is, the present invention provides an electroacoustic conversion film web, an electroacoustic conversion film, a manufacturing method of an electroacoustic conversion film web, and a manufacturing method of an electroacoustic conversion film with the following configurations.

(1) A manufacturing method of an electroacoustic conversion film web including a piezoelectric layer having dielectric properties, two thin film electrodes respectively formed on both surfaces of the piezoelectric layer, and two protective layers respectively formed on the two thin film electrodes, the method comprising: a preparation step of preparing an electrode laminated body in which one of the thin film electrodes and one of the protective layers are laminated; and a lamination step of laminating the electrode laminated body and the piezoelectric layer, in which wherein, in the lamination step, in a case where the electrode laminated body and the piezoelectric layer are laminated, at least one end portion of the thin film electrode is provided with a non-adhered portion that is not adhered to the piezoelectric layer.

(2) The manufacturing method of an electroacoustic conversion film web according to (1), in which the lamination step is a first lamination step of forming the piezoelectric layer by applying a coating composition that is to become the piezoelectric layer onto the thin film electrode of the electrode laminated body and thereafter curing the coating composition, and laminating the electrode laminated body and the piezoelectric layer, and in the first lamination step, in a case where the coating composition is applied, the non-adhered portion is formed by causing the at least one end portion of the thin film electrode to be a coating material non-coated portion to which the coating composition is not applied.

(3) The manufacturing method of an electroacoustic conversion film web according to (1), in which the lamination step is a second lamination step of laminating the electrode laminated body and the piezoelectric layer by bonding the piezoelectric layer to the thin film electrode side of the electrode laminated body, and in the second lamination step, the non-adhered portion is formed by causing the at least one end portion of the thin film electrode to be a non-bonded portion to which the piezoelectric layer is not bonded.

(4) The manufacturing method of an electroacoustic conversion film web according to (1), in which the preparation step is a step of preparing two electrode laminated bodies having different sizes, the lamination step includes a first lamination step of forming the piezoelectric layer by applying a coating composition that is to become the piezoelectric layer onto the thin film electrode of the electrode laminated body having a larger size and thereafter curing the coating composition, and laminating the electrode laminated body having a larger size and the piezoelectric layer, and a second lamination step of laminating the electrode laminated body having a smaller size and the piezoelectric layer by bonding the thin film electrode side of the electrode laminated body having a smaller size to the surface of the piezoelectric layer on the opposite side to the surface on which the electrode laminated body having a larger size is laminated, the electrode laminated body having a larger size being laminated on the piezoelectric layer, in the first lamination step, in a case where the coating composition is applied, the non-adhered portion is formed by causing the at least one end portion of the thin film electrode to be a coating material non-coated portion to which the coating composition is not applied, and in the second lamination step, the non-adhered portion is formed by causing the at least one end portion of the thin film electrode to be a non-bonded portion to which the piezoelectric layer is not bonded.

(5) The manufacturing method of an electroacoustic conversion film web according to (3) or (4), in which the second lamination step includes an adhesive application step of applying an adhesive to the thin film electrode side of the electrode laminated body, and a bonding step of bonding the piezoelectric layer to the electrode laminated body via the adhesive, and in the adhesive application step, the non-adhered portion is formed by causing the at least one end portion of the thin film electrode to be an adhesive non-coated portion to which the adhesive is not applied.

(6) The manufacturing method of an electroacoustic conversion film web according to any one of (3) to (5), in which the second lamination step is to bond the piezoelectric layer to the electrode laminated body through compression bonding, and the non-adhered portion is formed by causing the at least one end portion of the thin film electrode to be a non-compression-bonded portion to which the piezoelectric layer is not compression-bonded.

(7) The manufacturing method of an electroacoustic conversion film web according to any one of (3) to (6), in which, in the second lamination step, the non-adhered portion is formed by masking the at least one end portion of the thin film electrode and bonding the piezoelectric layer to the electrode laminated body.

(8) The manufacturing method of an electroacoustic conversion film web according to any one of (3) to (7), in which, in the second lamination step, an area of the thin film electrode laminated on the piezoelectric layer in a view in a direction perpendicular to a principal surface of the piezoelectric layer is smaller than an area of the piezoelectric layer.

(9) The manufacturing method of an electroacoustic conversion film web according to any one of (1) to (8), in which a width of the non-adhered portion is 5 to 20 mm.

(10) The manufacturing method of an electroacoustic conversion film web according to any one of (1) to (9), in which a shape of a principal surface of the thin film electrode is a quadrangular shape, and end portions of two edges of the thin film electrode which oppose each other serve as the non-adhered portions.

(11) The manufacturing method of an electroacoustic conversion film web according to any one of (1) to (10), in which a thickness of the electrode laminated body is 4 to 20 μm.

(12) The manufacturing method of an electroacoustic conversion film web according to any one of (1) to (11), in which the piezoelectric layer is a polymer composite piezoelectric body in which piezoelectric body particles are dispersed in a viscoelastic matrix formed of a polymer material having viscoelasticity at a normal temperature.

(13) The manufacturing method of an electroacoustic conversion film web according to (12), in which a local maximum value at which a loss tangent Tan δ at a frequency of 1 Hz becomes greater than or equal to 0.5 due to measurement of a dynamic viscoelasticity of the polymer material is present in a temperature range of 0° C. to 50° C.

(14) The manufacturing method of an electroacoustic conversion film web according to (12) or (13), in which the polymer material has a cyanoethyl group.

(15) The manufacturing method of an electroacoustic conversion film web according to any one of (12) to (14), in which the polymer material is cyanoethylated polyvinyl alcohol.

(16) A manufacturing method of an electroacoustic conversion film, comprising: a cutting step of cutting the electroacoustic conversion film web prepared in the manufacturing method of an electroacoustic conversion film web according to any one of (1) to (15), into a predetermined shape, in which, in the cutting step, the electroacoustic conversion film web is cut into a shape in which at least a portion of the non-adhered portion of the thin film electrode remains.

(17) An electroacoustic conversion film web comprising: a piezoelectric layer having dielectric properties; an upper thin film electrode formed on one principal surface of the piezoelectric layer; a lower thin film electrode formed on the other principal surface of the piezoelectric layer; an upper protective layer formed on the upper thin film electrode; and a lower protective layer formed on the lower thin film electrode, in which, in a view in a direction perpendicular to the principal surface of the piezoelectric layer, an area of the lower thin film electrode is larger than an area of the piezoelectric layer, and at least one end portion of the lower thin film electrode has a non-adhered portion on which the piezoelectric layer is not laminated, and in the view in the direction perpendicular to the principal surface of the piezoelectric layer, an area of the upper thin film electrode is smaller than the area of the piezoelectric layer, and at least one end portion of the upper thin film electrode has a non-adhered portion to which the piezoelectric layer is not adhered.

(18) An electroacoustic conversion film web comprising: a piezoelectric layer having dielectric properties; two thin film electrodes respectively formed on both surfaces of the piezoelectric layer; and two protective layers respectively formed on the two thin film electrodes, in which, in a view in a direction perpendicular to a principal surface of the piezoelectric layer, an area of each of the two thin film electrodes is smaller than an area of the piezoelectric layer, and at least one end portion of each of the thin film electrodes has a non-adhered portion to which the piezoelectric layer is not adhered.

(19) An electroacoustic conversion film comprising: a piezoelectric layer having dielectric properties; two thin film electrodes respectively formed on both surfaces of the piezoelectric layer; two protective layers respectively formed on the two thin film electrodes; regions in which the piezoelectric layer, the two thin film electrodes, and the two protective layers have the same shape and are adhered; and regions in which the piezoelectric layer, the two thin film electrodes, and the two protective layers overlap in a lamination direction and the piezoelectric layer and the two thin film electrodes are not adhered.

With the electroacoustic conversion film web, the electroacoustic conversion film, the manufacturing method of an electroacoustic conversion film web, and the manufacturing method of an electroacoustic conversion film of the present invention, costs can be reduced by reducing the number of operations without damage to thin film electrodes, the points of electrode lead-out portions can be freely determined, and thus high productivity can be achieved.

DESCRIPTION OF THE PREFERRED EMBODIMENTS

Hereinafter, an electroacoustic conversion film web, an electroacoustic conversion film, a manufacturing method of an electroacoustic conversion film web, and a manufacturing method of an electroacoustic conversion film of the present invention will be described in detail based on preferred embodiments shown in the accompanying drawings.

Descriptions of the constituent elements described below may be made based on representative embodiments of the present invention, but the present invention is not limited to the embodiments.

In this specification, a numerical range represented by using "to" means a range including numerical values described before and after "to" as a lower limit and an upper limit.

In this application, the "electroacoustic conversion film web" refers to a state before being processed (cut) into the electroacoustic conversion film with a final shape assembled into an electroacoustic transducer such as a speaker, and may be a film-like (sheet-like) material or may be a long film-like material. In the case of a long film-like material, the electroacoustic conversion film web may be wound into a roll shape, and in a case where the electroacoustic conversion film is processed, the electroacoustic conversion film web may be unwound from the roll around with the electroacoustic conversion film web is wound.

[Electroacoustic Conversion Film Web]

First, the electroacoustic conversion film web of the present invention prepared in the manufacturing method of an electroacoustic conversion film web of the present invention will be described.

A first embodiment of the electroacoustic conversion film web of the present invention is an electroacoustic conversion film web including: a piezoelectric layer having dielectric properties; an upper thin film electrode formed on one principal surface of the piezoelectric layer; a lower thin film electrode formed on the other principal surface of the piezoelectric layer; an upper protective layer formed on the upper thin film electrode; and a lower protective layer formed on the lower thin film electrode, in which, in a view in a direction perpendicular to the principal surface of the piezoelectric layer, the area of the lower thin film electrode is larger than the area of the piezoelectric layer and at least one end portion of the lower thin film electrode has a non-adhered portion on which the piezoelectric layer is not laminated, and in the view in the direction perpendicular to the principal surface of the piezoelectric layer, the area of the upper thin film electrode is smaller than the area of the piezoelectric layer and at least one end portion of the upper thin film electrode has a non-adhered portion to which the piezoelectric layer is not adhered.

The configuration of the electroacoustic conversion film web of the first embodiment will be described using FIGS. 1A and 1B.

Figure 1A:
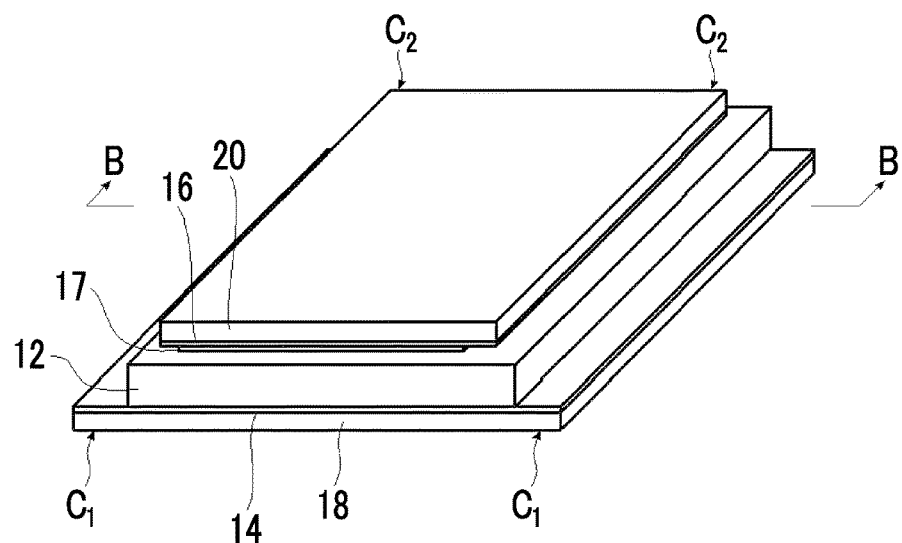
FIG. 1A is a schematic perspective view schematically illustrating an example of the electroacoustic conversion film web of the present invention.
Figure 1B:
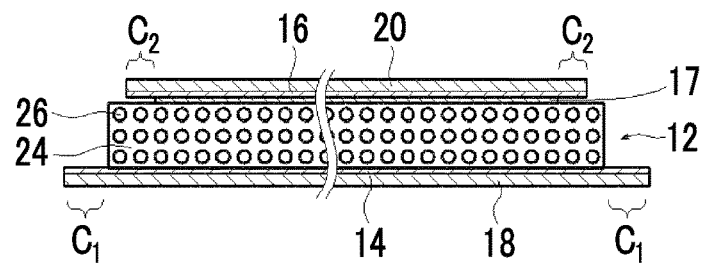
FIG. 1B is sectional view taken along line B-B of FIG. 1A.

FIG. 1A is a schematic perspective view illustrating an example of the electroacoustic conversion film web of the first embodiment of the present invention, and FIG. 1B is sectional view taken along line B-B of FIG. 1A.

An electroacoustic conversion film web (hereinafter, referred to as a conversion film web) 10 illustrated in FIGS. 1A and 1B basically includes a piezoelectric layer 12 which stretches and contracts in response to the state of an electric field, a lower thin film electrode 14 provided on one surface of the piezoelectric layer 12, a lower protective layer 18 provided on the surface of the lower thin film electrode 14, an upper thin film electrode 16 provided on the other surface of the piezoelectric layer 12, and an upper protective layer 20 provided on the surface of the upper thin film electrode 16.

Here, as illustrated in FIGS. 1A and 1B, in the conversion film web 10, in a view in a direction perpendicular to the principal surface of the piezoelectric layer 12, the area of the lower thin film electrode 14 is larger than the area of the piezoelectric layer 12, and each of two edges of the lower thin film electrode 14 which oppose each other has a non-adhered portion $C_1$ on which the piezoelectric layer 12 is not laminated. That is, the width of the lower thin film electrode 14 in left and right directions in FIG. 1B is larger than the width of the piezoelectric layer 12.

In addition, in the view in the direction perpendicular to the principal surface of the piezoelectric layer 12, the area of the upper thin film electrode 16 is smaller than the area of the piezoelectric layer 12, the piezoelectric layer 12 and the upper thin film electrode 16 are adhered to each other via an adhesive layer 17, the area of the upper thin film electrode 16 is larger than the area of the adhesive layer 17, and the width of the upper thin film electrode 16 in the left and right directions in FIG. 1B is larger than the width of the adhesive layer 17. Therefore, each of two edges of the upper thin film electrode 16, which oppose each other, has a region where the adhesive layer 17 is not formed, that is, a non-adhered portion $C_2$ to which the piezoelectric layer 12 is not adhered.

Each of the non-adhered portions $C_1$ of the lower thin film electrode 14 and the non-adhered portions $C_2$ of the upper thin film electrode 16 extends in a direction parallel to the edge where the corresponding non-adhered portion is formed, and is formed on a region from one edge adjacent to the edge to the other edge, that is, on the entire region in the longitudinal direction of the edge.

In addition, any of the two non-adhered portions $C_1$ and the two non-adhered portions $C_2$ are formed at the two edges of the piezoelectric layer 12 which oppose each other.

Figure 2:
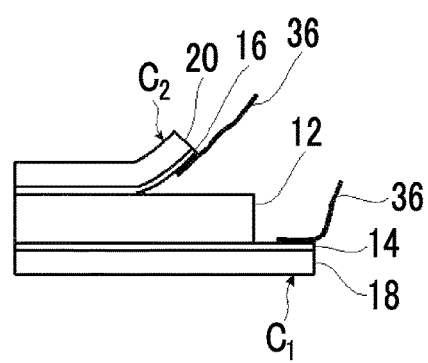
FIG. 2 is a partial enlarged sectional view of the electroacoustic conversion film web.

As illustrated in FIG. 2, the non-adhered portion $C_1$ of the lower thin film electrode 14 and the non-adhered portion $C_2$ of the upper thin film electrode 16 is a portion to which a wire 36 is connected, that is, an electrode lead-out portion. By connecting the wire 36 to the electrode lead-out portion, the thin film electrode and the external device can be electrically conducted.

In the manufacturing method of the electroacoustic conversion film web of the present invention, the non-adhered portion $C_1$ and the non-adhered portion $C_2$ which serve as the electrode lead-out portions can be formed while damage to the thin film electrodes is prevented and the number of operations and costs are reduced.

These points will be described in detail later.

Since the non-adhered portion $C_1$ and the non-adhered portion $C_2$ are provided on the entire region of at least one end portion of the thin film electrodes, the positions of the electrode lead-out portions can be freely determined by forming the prepared conversion film web into a desired shape through cutting, and thus the degree of freedom in design is high, resulting in an improvement in productivity.

Here, the width of each of the non-adhered portion $C_1$ and the non-adhered portion $C_2$ in the direction perpendicular to the corresponding edge is not particularly limited, and from a viewpoint of ensuring the size of an actual driving surface, is preferably 5 to 20 mm, and more preferably 8 to 15 mm.

In the illustrated example, the lower thin film electrode 14 is configured to have the two non-adhered portions $C_1$. However, the lower thin film electrode 14 is not limited thereto, and may have at least one non-adhered portion $C_1$. The lower thin film electrode 14 may also be configured to be provided with the non-adhered portion $C_1$ at each of the four edges of the lower thin film electrode 14 and thus have the four non-adhered portions $C_1$.

Similarly, in the illustrated example, the upper thin film electrode 16 is configured to have the two non-adhered portions $C_2$. However, the upper thin film electrode 16 is not limited thereto, and may have at least one non-adhered portion $C_2$. The upper thin film electrode 16 may also be configured to be provided with the non-adhered portion $C_2$ at each of the four edges of the upper thin film electrode 16 and thus have the four non-adhered portions $C_2$.

In the illustrated example, the two non-adhered portions $C_1$ are configured to be provided at the two edges which oppose each other. However, the two non-adhered portions $C_1$ are not limited thereto and may also be configured to be provided at two edges which are adjacent to each other.

Similarly, the two non-adhered portions $C_2$ may also be configured to be provided at two edges which are adjacent to each other.

As the number of non-adhered portions increase, the degree of freedom in design in a case where the electroacoustic conversion film having a desired shape is prepared by cutting the prepared electroacoustic conversion film web can be increased. However, in a case where the non-adhered portions are provided at three or more edges or in a case where two non-adhered portions are provided at two adjacent edges, there is concern that it may be difficult to employ a manufacturing process using so-called roll-to-roll and thus the manufacturing process may become complex.

Therefore, it is preferable that the two non-adhered portions are configured to be provided at two edges which oppose each other.

In the illustrated example, the non-adhered portion $C_1$ of the lower thin film electrode 14 and the non-adhered portion $C_2$ of the upper thin film electrode 16 are configured to be formed at the same edge of the piezoelectric layer 12. However, the non-adhered portion $C_1$ and the non-adhered portion $C_2$ are not limited thereto and may also be configured to be formed at different edges of the piezoelectric layer 12.

In the illustrated example, the upper thin film electrode 16 is adhered to the piezoelectric layer 12 via the adhesive layer 17. However, the upper thin film electrode 16 and the piezoelectric layer 12 are not limited thereto, and may be directly adhered to each other through compression bonding or the like without the adhesive layer 17.

Next, a second embodiment of the electroacoustic conversion film web of the present invention will be described.

The second embodiment of the electroacoustic conversion film web of the present invention is an electroacoustic conversion film web including: a piezoelectric layer having dielectric properties; two thin film electrodes respectively formed on both surfaces of the piezoelectric layer; and two protective layers respectively formed on the two thin film electrodes, in which, in a view in a direction perpendicular to a principal surface of the piezoelectric layer, the area of each of the two thin film electrodes is smaller than the area of the piezoelectric layer, and at least one end portion of each of the thin film electrodes has a non-adhered portion to which the piezoelectric layer is not adhered.

The configuration of the electroacoustic conversion film web of the second embodiment will be described with reference to FIG. 3.

Figure 3:
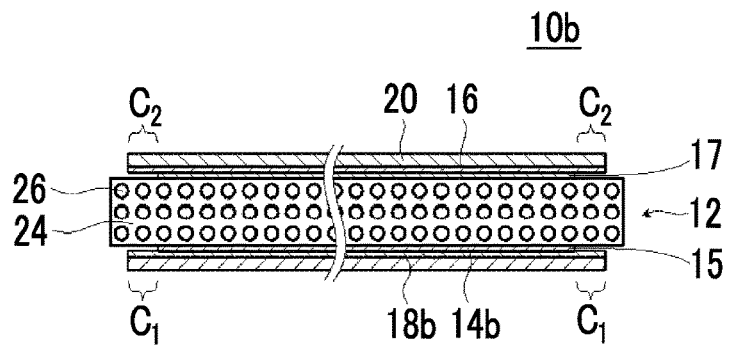
FIG. 3 is a schematic sectional view of an example of the electroacoustic conversion film web of the present invention.

FIG. 3 is a schematic sectional view illustrating an example of the electroacoustic conversion film web of the second embodiment of the present invention.

A conversion film web 10b illustrated in FIG. 3 is configured to include the piezoelectric layer 12, a lower thin film electrode 14b provided on one surface of the piezoelectric layer 12, a lower protective layer 18b provided on the surface of the lower thin film electrode 14b, the upper thin film electrode 16 provided on the other surface of the piezoelectric layer 12, and the upper protective layer 20 provided on the surface of the upper thin film electrode 16.

Since the conversion film web 10b illustrated in FIG. 3 has the same configuration as the conversion film web 10 illustrated in FIG. 1B except that the lower thin film electrode 14b, the lower protective layer 18b, and the adhesive layer 17 are provided instead of the lower thin film electrode 14 and the lower protective layer 18, like parts are denoted by like reference numerals, and different parts are mainly described in the following description.

As illustrated in FIG. 3, in the conversion film web 10b, in the view in the direction perpendicular to the principal surface of the piezoelectric layer 12, the area of the lower thin film electrode 14b is smaller than the area of the piezoelectric layer 12, the piezoelectric layer 12 and the lower thin film electrode 14b are adhered to each other via an adhesive layer 15, the area of the lower thin film electrode 14b is larger than the area of the adhesive layer 15, and each of two edges of the lower thin film electrode 14b, which oppose each other, has the non-adhered portion $C_1$ which is a region where the adhesive layer 15 is not formed.

That is, the lower thin film electrode 14b and the lower protective layer 18b have the same configurations as the upper thin film electrode 16 and the upper protective layer 20 except that the lower thin film electrode 14b and the lower protective layer 18b are laminated on the opposite surface of the piezoelectric layer 12.

In the manufacturing method of the electroacoustic conversion film web of the present invention, even in the case of manufacturing the conversion film web of the second embodiment, the non-adhered portion $C_1$ and the non-adhered portion $C_2$ can be formed while damage to the thin film electrodes is prevented and the number of operations and costs are reduced.

In addition, since the non-adhered portion $C_1$ and the non-adhered portion $C_2$ are provided on the entire region of at least one end portion of the thin film electrodes even in the conversion film web of the second embodiment, in a case where various shapes of conversion films are manufactured, the positions of the electrode lead-out portions can be freely determined by forming the prepared conversion film web into a desired shape through cutting, and thus the degree of freedom in design is high, resulting in an improvement in productivity.

[Electroacoustic Conversion Film]

The electroacoustic conversion film (hereinafter, referred to as "conversion film") of the present invention has is a conversion film obtained by cutting the above-described conversion film web into a desired shape and has a shape in which at least a portion of the non-adhered portion of the thin film electrode remains (see FIG. 8).

Therefore, the conversion film of the present invention is a conversion film including: a piezoelectric layer having dielectric properties; two thin film electrodes respectively formed on both surfaces of the piezoelectric layer; and two protective layers respectively formed on the two thin film electrodes, in which the piezoelectric layer, the two thin film electrodes, and the two protective layers have regions which have the same shape and are adhered, and the piezoelectric layer, the two thin film electrodes, and the two protective layers have regions which overlap each other in a lamination direction and in which the piezoelectric layer and the two thin film electrodes are not adhered to each other.

At least some regions of the non-adhered portions that are remained during the cutting are regions are the regions in which the piezoelectric layer and the two thin film electrodes are not adhered to each other, and are used as electrode lead-out portions (see FIG. 2).

The conversion film web of the present invention may also be used as the conversion film as it is without being cut.

Next, the material, configuration, and the like of each of constituent elements of the conversion film web and the conversion film will be described.

[Piezoelectric Layer]

In the conversion film web of the present invention, the piezoelectric layer 12 is a layer which has piezoelectric properties and stretches and contracts in an in-plane direction in response to the state of an electric field.

The piezoelectric layer 12 of the conversion film web illustrated in FIGS. 1B and 3 is a polymer composite piezoelectric body in which piezoelectric body particles 26 are dispersed in a matrix 24 formed of a polymer material.

In addition, the piezoelectric layer 12 is subjected to polarization processing.

In addition, the piezoelectric body particles 26 in the piezoelectric layer 12 may be dispersed in the viscoelastic matrix 24 with regularity or may also be irregularly dispersed therein.

Here, it is preferable that a polymer material having viscoelasticity at a normal temperature is used as the material of the matrix 24 (matrix-cum-binder) of the polymer composite piezoelectric body configuring the piezoelectric layer 12.

It is preferable that the polymer composite piezoelectric body (the piezoelectric layer 12) used in the conversion film web of the present invention has the following requisites. Therefore, it is preferable to use a polymer material having viscoelasticity at a normal temperature as the material having the following requisites.

Furthermore, herein, the "normal temperature" indicates a temperature range of approximately 0° C. to 50° C.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, in a case where the polymer composite piezoelectric body is hard, large bending stress is generated to that extent, and a crack is generated at the interface between the polymer matrix and the piezoelectric body particles, and thus the piezoelectric layer may be broken. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy, and thus a sound is reproduced. Accordingly, in order to increase the transmission efficiency of the vibration energy, the polymer composite piezoelectric body is required to have suitable hardness. In addition, in a case where the frequency properties of the speaker become smooth, the changed amount of the acoustic quality at the time that the lowest resonance frequency $f_0$ is changed according to a change in the curvature also decreases. Accordingly, the loss tangent of the polymer composite piezoelectric body is required to be suitably large.

As described above, the polymer composite piezoelectric body used in the conversion film web of the present invention is required to be rigid with respect to a vibration of 20 Hz to 20 kHz, and to be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time that the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, in a case where a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride coacrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The matrix 24 using such a polymer material having viscoelasticity at a normal temperature, as necessary, may use a plurality of polymer materials in combination.

That is, in order to adjust dielectric properties or mechanical properties, other dielectric polymer materials may be added to the matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point (Tg), a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the matrix 24 of the piezoelectric layer 12, the added amount at the time of adding a polymer in addition to the viscoelastic material such as cyanoethylated PVA is not particularly limited, and it is preferable that a ratio of the added polymer to the matrix 24 is less than or equal to 30 vol %.

Accordingly, it is possible to exhibit the properties of the polymer material to be added without impairing the viscoelasticity relieving mechanism of the matrix 24, and thus a preferred result is able to be obtained from a viewpoint of increasing a dielectric constant, of improving heat resistance, and of improving adhesiveness between the piezoelectric body particles 26 and the electrode layer.

Furthermore, in the present invention, the material of the matrix 24 is not limited to the polymer material having viscoelasticity at a normal temperature and may also use the above-mentioned dielectric polymer or the like.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

The particle diameter of the piezoelectric body particles 26 may be appropriately selected according to the size or usage of the conversion film web, and is preferably 1 μm to 10 μm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 1, the piezoelectric body particles 26 in the piezoelectric layer 12 are uniformly dispersed in the matrix 24 with regularity. However, the piezoelectric body particles 26 may also be irregularly dispersed therein.

In the conversion film web of the present invention, a quantitative ratio of the matrix 24 and the piezoelectric body particles 26 in the piezoelectric layer 12 may be appropriately set according to the size in the surface direction or the thickness of the conversion film web, the usage of the conversion film web, properties required for the conversion film web, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the matrix 24 and the piezoelectric body particles 26 to be in the range described above, it is possible to obtain a preferred result from a viewpoint of making high piezoelectric properties and flexibility compatible.

In addition, in the conversion film web of the present invention, the thickness of the piezoelectric layer 12 is not also particularly limited, and may be appropriately set according to the size of the conversion film web, the usage of the conversion film web, properties required for the conversion film web, and the like.

Here, according to the consideration of the present inventors, the thickness of the piezoelectric layer 12 is preferably 5 to 100 μm, more preferably 5 to 50 μm, and particularly preferably 5 to 30 μm.

By setting the thickness of the piezoelectric layer 12 to be in the range described above, it is possible to obtain a preferred result from viewpoint of making ensuring stiffness and appropriate flexibility compatible, responsiveness, and widening of a reproducible band.

Furthermore, as described above, it is preferable that the piezoelectric layer 12 is subjected to polarization processing (poling). The polarization processing will be described below in detail.

In addition, in the embodiment described above, the polymer composite piezoelectric body is used as the piezoelectric layer 12. However, the present invention is not limited thereto, and a polymer piezoelectric material having piezoelectric properties, such as polyvinylidene fluoride (PVDF) may also be used.

While monoaxially stretched PVDF has in-plane anisotropy in the piezoelectric properties thereof, the polymer composite piezoelectric body does not have in-plane anisotropy. Therefore, the polymer composite piezoelectric body is able to more suitably convert a stretching and contracting movement into a forward and rearward movement compared to PVDF and is thus able to obtain acoustic quality with a sufficient sound volume, which is preferable.

[Protective Layers]

As illustrated in FIGS. 1B and 3, the conversion film web of the present invention has a configuration in which the piezoelectric layer 12 is interposed between the lower thin film electrode 14 and the upper thin film electrode 16, and this laminated body is interposed between the lower protective layer 18 and the upper protective layer 20.

In the conversion film web, the lower protective layer 18 and the upper protective layer 20 have a function of applying appropriate stiffness and mechanical strength to the polymer composite piezoelectric body. That is, there may be a case where, in the conversion film web of the present invention, the polymer composite piezoelectric body (the piezoelectric layer 12) consisting of the matrix 24 and the piezoelectric body particles 26 exhibits extremely superior flexibility under bending deformation at a slow vibration but has insufficient stiffness or mechanical strength depending on the usage. For compensation for this, the conversion film web is provided with the lower protective layer 18 and the upper protective layer 20.

In addition, since the lower protective layer 18 and the upper protective layer 20 are different from each other only in position and size and have the same configuration, in the following description, in a case where there is no need to distinguish between the lower protective layer 18 and the upper protective layer 20, both the members are collectively referred to as a protective layer.

The protective layer is not particularly limited, and may use various sheet-like materials. As an example, various resin films (plastic films) are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), and a cyclic olefin-based resin are suitably used.

The thicknesses of the protective layers are not particularly limited. In addition, the thicknesses of the protective layers may be basically identical to each other or different from each other.

Here, in a case where the stiffness of the protective layer excessively increases, not only is the stretching and contracting of the piezoelectric layer 12 constrained, but also the flexibility is impaired, and thus it is advantageous as the thickness of the protective layer becomes thinner unless mechanical strength or excellent handleability as a sheet-like material is required.

Here, according to the consideration of the present inventors, in a case where the thickness of each of the protective layers is less than or equal to twice the thickness of the piezoelectric layer 12, it is possible to obtain a preferred result from a viewpoint of compatibility between ensuring of the stiffness and appropriate flexibility, or the like.

For example, in a case where the thickness of the piezoelectric layer 12 is 50 μm and the lower protective layer 18 and the upper protective layer 20 are formed of PET, the thickness of each of the lower protective layer 18 and the upper protective layer 20 is preferably less than or equal to 100 μm, and more preferably less than or equal to 50 μm, and particularly preferably less than or equal to 25 μm.

[Thin Film Electrodes]

In the conversion film web of the present invention, the lower thin film electrode 14 is formed between the piezoelectric layer 12 and the lower protective layer 18, and the upper thin film electrode 16 is formed between the piezoelectric layer 12 and the upper protective layer 20.

The lower thin film electrode 14 and the upper thin film electrode 16 are provided to apply a voltage to the piezoelectric layer 12.

In addition, since the lower thin film electrode 14 and the upper thin film electrode 16 are different from each other only in size position and have the same configuration, in the following description, in a case where there is no need to distinguish between the lower thin film electrode 14 and the upper thin film electrode 16, both the members are collectively referred to as a thin film electrode.

In the present invention, a forming material of the thin film electrode is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, and the like are exemplified. Among them, any one of copper, aluminum, gold, silver, platinum, and indium-tin oxide is suitably exemplified.

In addition, a forming method of the thin film electrode is not particularly limited, and as the forming method, various known methods such as a vapor-phase deposition method (a vacuum film forming method) such as vacuum vapor deposition or sputtering, film formation using plating, and a method of adhering a foil formed of the materials described above are able to be used.

Among them, in particular, by the reason that the flexibility of the conversion film web is able to be ensured, a copper or aluminum thin film formed by using the vacuum vapor deposition is suitably used as the thin film electrode. Among them, in particular, the copper thin film formed by using the vacuum vapor deposition is suitably used.

The thicknesses of the thin film electrodes are not particularly limited. In addition, the thicknesses of the thin film electrodes may be basically identical to each other or different from each other.

Here, like the protective layer described above, in a case where the stiffness of the thin film electrode excessively increases, not only is stretching and contracting of the piezoelectric layer 12 constrained, but also flexibility is impaired. For this reason, in a case where the thin film electrode is in a range where electrical resistance does not excessively increase, it is advantageous as the thickness becomes thinner.

In addition, according to the consideration of the present inventors, in a case where the product of the thickness of the thin film electrode and the Young's modulus is less than the product of the thickness of the protective layer and the Young's modulus, the flexibility is not considerably impaired, which is suitable.

For example, in a case of a combination of the protective layer formed of PET (Young's modulus: approximately 6.2 GPa) and the thin film electrode formed of copper (Young's modulus: approximately 130 GPa), in a case where the thickness of the protective layer is 25 μm, the thickness of the thin film electrode is preferably less than or equal to 1.2 μm, more preferably less than or equal to 0.3 μm, and particularly preferably less than or equal to 0.1 μm.

As described above, in the conversion film web of the present invention, the piezoelectric layer 12 (the polymer composite piezoelectric body) in which the piezoelectric body particles 26 are dispersed in the matrix 24 is interposed between the lower thin film electrode 14 and the upper thin film electrode 16, and this laminated body is interposed between the lower protective layer 18 and the upper protective layer 20.

In the conversion film web of the present invention, it is preferable that the local maximum value in which the loss tangent (Tan δ) at a frequency of 1 Hz according to the dynamic viscoelasticity measurement is greater than or equal to 0.5 exists at a normal temperature.

Accordingly, even in a case where the conversion film web is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the conversion film web of the present invention, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the conversion film web is able to have large frequency dispersion in the storage elastic modulus (E') at a normal temperature. That is, the conversion film 10 is able to be rigid with respect to a vibration of 20 Hz to 20 kHz, and is able to be flexible with respect to a vibration of less than or equal to a few Hz.

In addition, in the conversion film web of the present invention, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the conversion film web is able to have appropriate stiffness and mechanical strength within a range not impairing the flexibility and the acoustic properties of the conversion film web.

Furthermore, in the conversion film web of the present invention, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of a speaker using a conversion film cut from the conversion film web become smooth, and thus it is also possible to decrease the changed amount of the acoustic quality at the time that the lowest resonance frequency $f_0$ is changed according to the change in the curvature of the speaker.

[Manufacturing Method of Electroacoustic Conversion Film Web]

Next, the manufacturing method of an electroacoustic conversion film web of the present invention will be described.

The manufacturing method of an electroacoustic conversion film web of the present invention is a manufacturing method of an electroacoustic conversion film web including a piezoelectric layer having dielectric properties, two thin film electrodes respectively formed on both surfaces of the piezoelectric layer, and two protective layers respectively formed on the two thin film electrodes, the method including: a preparation step of preparing an electrode laminated body in which one of the thin film electrodes and one of the protective layers are laminated; and a lamination step of laminating the electrode laminated body and the piezoelectric layer, in which, in the lamination step, in a case where the electrode laminated body and the piezoelectric layer are laminated, at least one end portion of the thin film electrode is provided with a non-adhered portion that is not adhered to the piezoelectric layer.

Here, the lamination step is at least one of a first lamination step which is a step of forming the piezoelectric layer by applying a coating composition that is to become the piezoelectric layer onto the thin film electrode of the electrode laminated body and thereafter curing the coating composition, and laminating the electrode laminated body and the piezoelectric layer, in which, in a case where the coating composition is applied, the non-adhered portion is formed by causing the at least one end portion of the thin film electrode to be a coating material non-coated portion to which the coating composition is not applied, or a second lamination step which is a step of laminating the electrode laminated body and the piezoelectric layer by bonding the piezoelectric layer to the thin film electrode side of the electrode laminated body, in which the non-adhered portion is formed by causing the at least one end portion of the thin film electrode to be a non-bonded portion to which the piezoelectric layer is not bonded.

Here, the electrode laminated bodies are laminated on both surfaces of the piezoelectric layer. Therefore, the first lamination step may be performed in a case where the electrode laminated body is laminated on one surface of the piezoelectric layer and the second lamination step may be performed in a case where the electrode laminated body is laminated on the other surface of the piezoelectric layer as the electrode lead-out portion, or the electrode laminated bodies may be laminated on both surfaces in the second lamination step.

Hereinafter, the manufacturing method of an electroacoustic conversion film web of the present invention (hereinafter, referred to as a manufacturing method of the present invention) will be described with reference to FIGS. 4A to 4E and FIGS. 5A to 5C.

Figure 4A:
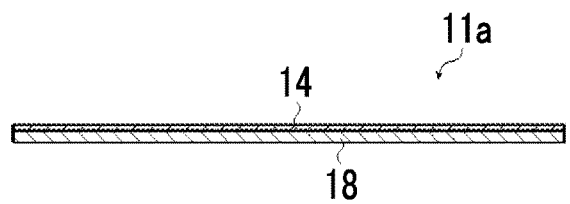
FIG. 4A is a conceptual view illustrating an example of a manufacturing method of an electroacoustic conversion film web of the present invention.
Figure 4B:
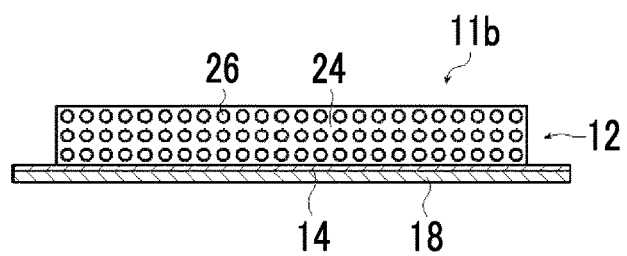
FIG. 4B is a conceptual view illustrating the example of the manufacturing method of an electroacoustic conversion film web of the present invention.
Figure 4C:
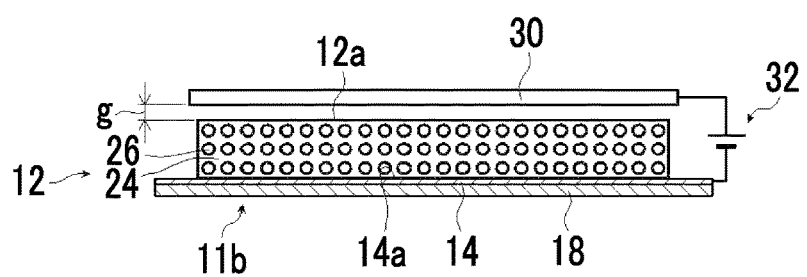
FIG. 4C is a conceptual view illustrating the example of the manufacturing method of an electroacoustic conversion film web of the present invention.
Figure 4D:
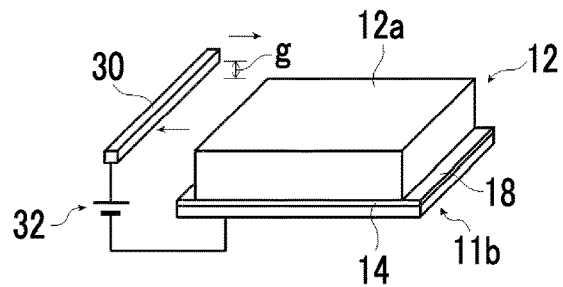
FIG. 4D is a conceptual view illustrating the example of the manufacturing method of an electroacoustic conversion film web of the present invention.
Figure 4E:
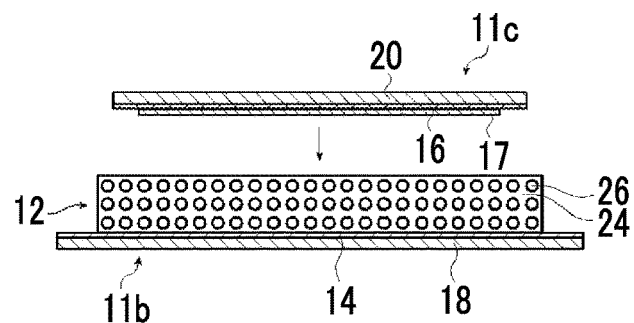
FIG. 4E is a conceptual view illustrating the example of the manufacturing method of an electroacoustic conversion film web of the present invention.
Figure 5A:
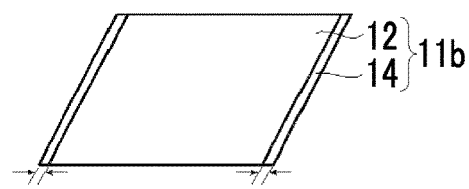
FIG. 5A is a schematic perspective view illustrating an example of the manufacturing method of an electroacoustic conversion film web of the present invention.
Figure 5B:
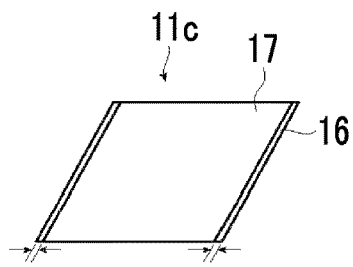
FIG. 5B is a schematic perspective view illustrating the example of the manufacturing method of an electroacoustic conversion film web of the present invention.
Figure 5C:
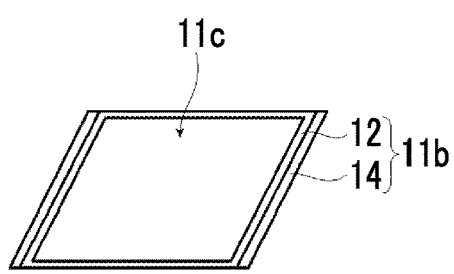
FIG. 5C is a schematic perspective view illustrating the example of the manufacturing method of an electroacoustic conversion film web of the present invention.

FIGS. 4A to 4E are conceptual views illustrating an example of the manufacturing method of the present invention, and FIGS. 5A to 5C are schematic perspective views illustrating the second lamination step.

In the following description, the manufacturing method of the present invention will be described by describing the manufacturing method for preparing the electroacoustic conversion film web 10 illustrated in FIGS. 1A and 1B.

[Preparation Step]

The preparation step is a step of preparing the electrode laminated body in which the single thin film electrode and the single protective layer are laminated.

First, as illustrated in FIG. 4A, a lower electrode laminated body 11a which is a sheet-like material in which the lower thin film electrode 14 and the lower protective layer 18 are laminated is prepared.

First, as illustrated in FIG. 4E, an upper electrode laminated body 11c which is a sheet-like material in which the upper thin film electrode 16 and the upper protective layer 20 are laminated is prepared.

The lower electrode laminated body 11a may be prepared by forming a copper thin film or the like as the lower thin film electrode 14 on the surface of the lower protective layer 18 using vacuum vapor deposition, sputtering, plating, and the like.

Similarly, the upper electrode laminated body 11c may be prepared by forming a copper thin film or the like as the upper thin film electrode 16 on the surface of the upper protective layer 20 using vacuum vapor deposition, sputtering, plating, and the like.

Here, the principal surface of the upper electrode laminated body 11c is smaller than the principal surface of the lower electrode laminated body 11a. In the illustrated example, the principal surface of the upper electrode laminated body 11c has the same length as one principal surface of the lower electrode laminated body 11a and has a different length from the other.

In a case where the protective layer is extremely thin, and thus the handleability is degraded, the protective layer with a separator (temporary supporter) may be used. As the separator, a PET film having a thickness of approximately 25 to 100 μm, and the like are able to be used. The separator may be removed after the lamination of the thin film electrodes and the protective layers.

Alternatively, a commercially available product in which the copper thin film or the like is formed on the protective layer may be used as the electrode laminated body.

[First Lamination Step]

The first lamination step is the step of forming the piezoelectric layer by applying the coating composition that is to become the piezoelectric layer onto the thin film electrode of the electrode laminated body and thereafter curing the coating composition, and laminating the electrode laminated body and the piezoelectric layer. In the present invention, in the first lamination step, in a case where the coating composition is applied, the non-adhered portion is formed by causing the at least one end portion of the thin film electrode to be the coating material non-coated portion to which the coating composition is not applied.

First, the coating composition (coating material) is prepared by dissolving a polymer material as the material of a matrix such as cyanoethylated PVA in an organic solvent, adding the piezoelectric body particles 26 such as PZT particles thereto, and stirring and dispersing the resultant.

The organic solvent is not particularly limited, and as the organic solvent, various organic solvents are able to be used.

In a case where the lower electrode laminated body 11a described above is prepared and the coating material is prepared, the coating material is cast (applied) onto the lower thin film electrode 14 side of the lower electrode laminated body 11a, and the organic solvent is evaporated and dried. Accordingly, as illustrated in FIG. 4B, a laminated body 11b in which the lower thin film electrode 14 is provided on the lower protective layer 18 and the piezoelectric layer 12 is formed on the lower thin film electrode 14 is prepared.

Here, as described, in the first lamination step, in the case where the coating composition is applied, the coating composition is applied to not the entire surface of the lower thin film electrode side of the electrode laminated body but is applied only to a portion of the region thereof, and at least one end portion of the thin film electrode (the electrode laminated body) serves as the coating material non-coated portion to which the coating composition is not applied.

In this embodiment, as illustrated in FIGS. 4B and 5A, the coating composition is not applied to each of two edges of the lower electrode laminated body 11a which oppose each other, and two coating material non-coated portions are formed. The coating material non-coated portions serve as the non-adhered portions $C_1$ of the conversion film web 10 illustrated in FIG. 1B.

A casting method of the coating material is not particularly limited, and as the casting method, all known methods (coating devices) such as a slide coater or a doctor knife are able to be used.

In addition, a method of applying the coating composition only to a portion of the region of the lower thin film electrode 14 side of the lower electrode laminated body 11a is not particularly limited, and for example, in a case where the coating material is cast with a slide coater, the width of the slit opening through which the coating material is discharged may be adjusted to be smaller than the width of the lower thin film electrode 14. Alternatively, a region of the end portion that is to become the coating material non-coated portion may be subjected to masking, and then the application may be performed.

In addition, as described above, in the conversion film web 10 of the present invention, in addition to the viscoelastic material such as cyanoethylated PVA, a polymer piezoelectric material such as PVDF may be added to the matrix 24.

In a case where the polymer piezoelectric material is added to the matrix 24, the polymer piezoelectric material added to the coating material may be dissolved.

In a case where the laminated body 11b in which the lower thin film electrode 14 is provided on the lower protective layer 18 and the piezoelectric layer 12 is formed on the lower thin film electrode 14 is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 4C and 4D is exemplified.

In this method, as illustrated in FIGS. 4C and 4D, for example, a gap g of 1 mm is opened on an upper surface 12a of the piezoelectric layer 12 of the laminated body 11b, and a rod-like or wire-like corona electrode 30 which is able to be moved along the upper surface 12a is provided. Then, the corona electrode 30 and the lower thin film electrode 14 are connected to a direct-current power source 32.

Furthermore, heating means for heating and holding the laminated body 11b, for example, a hot plate is prepared.

Then, in a state where the piezoelectric layer 12 is heated and held by the heating means, for example, at a temperature of 100° C., a direct-current voltage of a few kV, for example, 6 kV, is applied between the lower thin film electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 11b is provided, and the polarization processing may be performed by moving the laminated body 11b. Moving means for a known sheet-like material may be used to move the laminated body 11b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper thin film electrode 16 is formed before the polarization processing.

Before the polarization processing, calender processing may be performed to smoothen the surface of the piezoelectric layer 12 using a heating roller or the like. By performing the calender processing, lamination of the upper electrode laminated body 11c, which will be described later, is able to be smoothly performed.

[Second Lamination Step]

The second lamination step is the step of laminating the electrode laminated body and the piezoelectric layer by bonding the piezoelectric layer to the thin film electrode side of the electrode laminated body. In the present invention, the second lamination step is the step in which the non-adhered portion is formed by causing the at least one end portion of the thin film electrode to be the non-bonded portion to which the piezoelectric layer is not bonded.

In this embodiment, the second lamination step includes an adhesive application step of applying an adhesive to the thin film electrode side of the electrode laminated body, and a bonding step of bonding the piezoelectric layer to the electrode laminated body via the adhesive. In the adhesive application step, the non-adhered portion is formed by causing the at least one end portion of the thin film electrode to be an adhesive non-coated portion to which the adhesive is not applied.

(Adhesive Application Step)

While the polarization processing of the piezoelectric layer 12 of the laminated body 11b is performed, the adhesive layer 17 is formed by applying the adhesive to the upper electrode laminated body 11c which is the sheet-like material prepared in the preparation step in which the upper thin film electrode 16 is formed on the upper protective layer 20.

Here, in the adhesive application step, in a case where the adhesive is applied, the non-adhered portion is applied not the principal surface of the upper thin film electrode 16 but is applied only to a portion of the region thereof such that the at least one end portion of the upper thin film electrode 16 becomes the adhesive non-coated portion to which the adhesive is not applied.

In the example illustrated in FIG. 5B, the adhesive is not applied to each of two edges of the upper electrode laminated body 11c which oppose each other, and two adhesive non-coated portions are formed. The adhesive non-coated portions serve as the non-adhered portions $C_2$ of the conversion film web 10 illustrated in FIG. 1B.

An application method of the adhesive is not particularly limited, and as the application method, all known methods (coating devices) such as a slide coater or a doctor knife are able to be used.

In addition, a method of applying the adhesive only to a portion of the region of the upper thin film electrode 16 side of the upper electrode laminated body 11c is not particularly limited, and for example, in a case where the adhesive is applied with a slide coater, the width of the slit opening may be adjusted to be smaller than the width of the upper thin film electrode 16. Alternatively, a region of the end portion that is to become the adhesive non-coated portion may be subjected to masking, and then the application may be performed.

The material of the adhesive is not particularly limited, and a known adhesive used for adhesion between the piezoelectric layer and the thin film electrode in the conversion film can be appropriately used. In a case where a polymer composite piezoelectric body in which piezoelectric body particles are dispersed in a matrix formed of a polymer material is used as the piezoelectric layer, the same polymer material as the material of the matrix may be used as the adhesive.

(Bonding Step)

Next, as the bonding step, as illustrated in FIGS. 4E and 5C, the upper electrode laminated body 11c is bonded to and laminated on the laminated body 11b in which the piezoelectric layer 12 is subjected to the polarization processing while the upper thin film electrode 16 side on which the adhesive layer 17 is formed faces the piezoelectric layer 12 such that the conversion film web 10 is prepared.

Here, the adhesive non-coated portion of the upper electrode laminated body 11c in which the adhesive 17 is not formed is not adhered to the piezoelectric layer 12 and thus becomes the non-adhered portion $C_2$ of the conversion film web 10.

As described above, a piezoelectric film used as a thin speaker needs to be thinner from viewpoints of not only thinning of the speaker, but also responsiveness and widening of a reproducible band. However, in a thin electrode layer such as a vapor-deposited film, it is difficult to connect wires by soldering or the like. In addition, connection of wires to the thin film electrodes needs to be performed while insulation between the thin film electrodes on both surfaces of the piezoelectric layer is ensured. However, the connection of wires is not easy because the thickness of the piezoelectric layer is as thin as approximately tens of µm.

By adopting a configuration in which an electrode laminated body has an electrode lead-out portion which protrudes in a convex shape in the outer portion of a piezoelectric layer in a surface direction, electrodes can be drawn from thin film electrodes and connection of wires by soldering can be easily performed. Furthermore, drawing of the electrodes can be performed while insulation between the thin film electrodes on both surfaces is ensured.

However, in a method of providing the electrode lead-out portion protruding in a convex shape by entirely laminating the piezoelectric layer and the electrode laminated body, rubbing the piezoelectric layer with a cotton swab or the like impregnated with a solvent or the like, and dissolving and removing a portion of the piezoelectric layer, there is concern that the thin film electrodes may be damaged, for example, the thin film electrodes may be dissolved. In addition, there are problems that the number of operations increases, the investment in facilities increases, and costs increase.

In addition, since the electrode lead-out portion is formed in a shape protruding in a convex shape, it is necessary that the position of the electrode lead-out portion is determined in advance in a case where an electroacoustic conversion film is prepared, and the position of the electrode lead-out portion cannot be changed after the preparation. Therefore, in a case where various shapes of electroacoustic conversion films in which the positions, shapes, and the like of electrode lead-out portions vary are prepared, it is necessary that preparation conditions in a step of forming the electrode lead-out portion are changed for each of the electroacoustic conversion films, and there is a problem that productivity cannot be increased.

In contrast, in the manufacturing method of the present invention, the configuration in which, in the lamination step, in a case where the electrode laminated body and the piezoelectric layer are laminated, the non-adhered portion that is not adhered to the piezoelectric layer is provided in at least one end portion of the thin film electrode is provided.

Specifically, in a case where the coating composition that is to become the piezoelectric layer is applied onto the thin film electrode, the non-adhered portion is formed by causing at least one end portion of the thin film electrode to be the coating material non-coated portion to which the coating composition is not applied. Alternatively, in a case where the electrode laminated body and the piezoelectric layer are laminated, the non-adhered portion is formed by causing at least one end portion of the thin film electrode to be the non-bonded portion that is not bonded to the piezoelectric layer.

As described above, in the present invention, in the case where the piezoelectric layer and the thin film electrode are laminated, the non-adhered portion that is not adhered to the piezoelectric layer is formed in the thin film electrode. Therefore, there is no need to dissolve or remove the piezoelectric layer, and thus the thin film electrode is not damaged. In addition, since the non-adhered portions are formed simultaneously with the step of laminating the piezoelectric layer and the thin film electrodes, an increase in the number of operation steps can be suppressed, and an increase in the investment in the facilities and costs can be suppressed.

Here, the method of laminating the piezoelectric layer and the electrode laminated body in the second lamination step is not limited to the method using the adhesive.

For example, a conversion film web may also be prepared by subjecting the piezoelectric layer and the electrode laminated body to thermal compression bonding using a heating press device, a heating roller pair, or the like.

In the case where the piezoelectric layer and the electrode laminated body are laminated by the thermal compression bonding, the non-adhered portion may be formed by causing at least one end portion of the electrode laminated body (the thin film electrode) to be a non-thermal-compression-bonded portion that is not thermal-compression-bonded to the piezoelectric layer.

Figure 6:
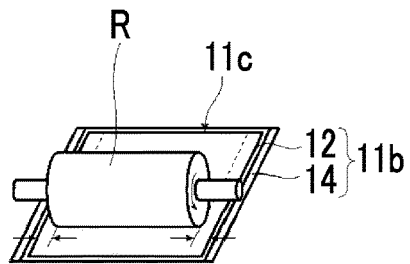
FIG. 6 is a schematic perspective view illustrating another example of the manufacturing method of an electroacoustic conversion film web of the present invention.

For example, in a case where thermal compression bonding is performed using the heating roller, as illustrated in FIG. 6, the non-adhered portion may be formed by subjecting a region other than both end portions of the upper electrode laminated body 11c to the thermal compression bonding using a heating roller R having a smaller width than the upper electrode laminated body 11c.

Figure 7A:
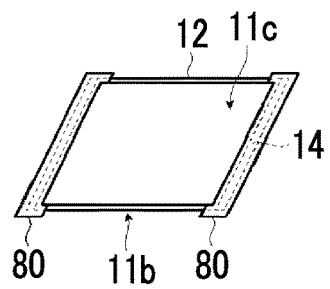
FIG. 7A is a schematic perspective view illustrating another example of the manufacturing method of an electroacoustic conversion film web of the present invention.
Figure 7B:
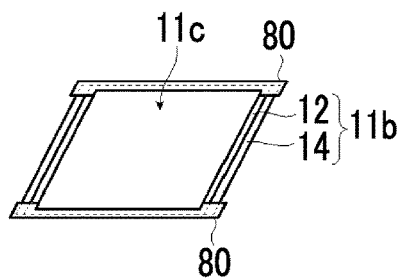
FIG. 7B is a schematic perspective view illustrating another example of the manufacturing method of an electroacoustic conversion film web of the present invention.

Alternatively, as illustrated in FIGS. 7A and 7B, mask members 80 may be disposed at both end portions of the upper electrode laminated body 11c, the piezoelectric layer 12 and the upper electrode laminated body 11c may be subjected to compression bonding to adhere the piezoelectric layer 12 and the upper electrode laminated body 11c to each other in a region other than the regions masked with the mask members 80, thereby forming the non-adhered portions in the masked regions of the upper electrode laminated body 11c.

In addition, FIG. 7A illustrates an example of a case where the non-adhered portion of the upper electrode laminated body 11c (the upper thin film electrode 16) and the non-adhered portion of the lower thin film electrode 14 are formed on the same edge side of the piezoelectric layer 12, and FIG. 7B illustrates an example of a case where the non-adhered portion of the upper thin film electrode 16 and the non-adhered portion of the lower thin film electrode 14 are formed on different edge sides of the piezoelectric layer 12.

Here, as described above, the width of the non-adhered portion formed in the first lamination step and the width of the non-adhered portion formed in the second lamination step is preferably 5 to 20 mm, and more preferably 8 to 15 mm.

In the above example, the first lamination step and the second lamination step, the configuration in which the two non-adhered portions are respectively formed on the two opposing edge sides is adopted. However, the non-adhered portions are not limited thereto, and a configuration in which the non-adhered portion is formed at least one edge side, or a configuration in which non-adhered portions are respectively formed on four edge sides may be adopted.

In the manufacturing method of the present invention, even in a case where the thickness of the electrode laminated body is thin, the non-adhered portion which serves as the electrode lead-out portion can be easily formed without damage to the thin film electrode. From this viewpoint, the manufacturing method of the present invention can be more suitably applied to a case where the thickness of the electrode laminated body is 4 to 20 μm.

Here, in the above description, the method of preparing the conversion film web illustrated in FIGS. 1A and 1B by performing lamination in the first lamination step in the case where the electrode laminated body is laminated on one surface of the piezoelectric layer and performing lamination in the second lamination step in the case where the electrode laminated body is laminated on the other surface is described. However, the manufacturing method of the present invention is not limited thereto, and the conversion film web 10b illustrated in FIG. 3 may also be prepared by laminating the electrode laminated bodies on both surfaces in the second lamination step.

In a case where the electrode laminated bodies are laminated on both surfaces of the piezoelectric layer in the second lamination step, first, the piezoelectric layer is formed on a temporary supporter, and the electrode laminated body is formed on the opposite surface of the piezoelectric layer to the temporary supporter by applying the second lamination step described above. Next, the temporary supporter is peeled off from the piezoelectric layer, and the electrode laminated body is laminated on the surface of the piezoelectric layer from which the temporary supporter is peeled off by applying the second lamination step, thereby preparing the conversion film web 10b illustrated in FIG. 3.

[Manufacturing Method of Electroacoustic Conversion Film]

Next, the manufacturing method of an electroacoustic conversion film of the present invention will be described.

The manufacturing method of an electroacoustic conversion film of the present invention is a manufacturing method of an electroacoustic conversion film, including: a cutting step of cutting the conversion film web prepared in the manufacturing method of an electroacoustic conversion film web described above, into a predetermined shape, in which, in the cutting step, the electroacoustic conversion film web is cut into a shape in which at least a portion of the non-adhered portion of the thin film electrode remains.

(Cutting Step)

The cutting step is a step of cutting the conversion film web 10 in which the electrode laminated bodies are laminated on both surfaces of the piezoelectric layer in the lamination step into a predetermined shape.

Here, the conversion film web 10 is cut into a shape in which at least portions of the non-adhered portion $C_1$ of the lower thin film electrode 14 and the non-adhered portion $C_2$ of the upper thin film electrode 16 remain.

Figure 8:
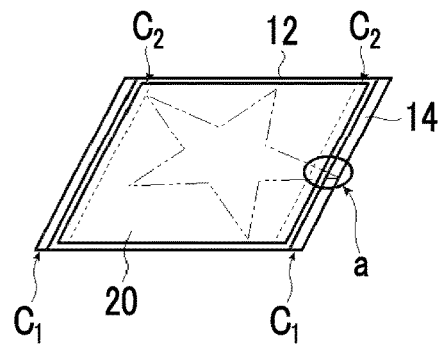
FIG. 8 is a schematic perspective view illustrating a cutting step in a manufacturing method of an electroacoustic conversion film of the present invention.

For example, the example illustrated in FIG. 8 illustrates an example in which the conversion film web 10 is cut to cut out a star shape indicated by the two-dot chain line. In FIG. 8, the conversion film web is cut to include the non-adhered portions $C_1$ and $C_2$ in the part indicated by a in the figure and is used as a conversion film.

The conversion film prepared as described above has a shape having regions in which the piezoelectric layer, the two thin film electrodes, and the two protective layers have the same shape and are adhered, and regions in which the piezoelectric layer, the two thin film electrodes, and the two protective layers overlap in a lamination direction and the piezoelectric layer and the two thin film electrodes are not adhered. The regions in which the piezoelectric layer and the two thin film electrodes are not adhered can be used as the electrode lead-out portions.

In the present invention, the predetermined shape is a desired shape according to the shape of a thin speaker to be used, or the like. The shape (predetermined shape) of the conversion film cut in the cutting step is not particularly limited, and may be appropriately set according to the shape of the thin speaker to be used, or the like.

In the conversion film web prepared in the manufacturing method of the present invention, since the non-adhered portion is provided on the entire region of at least one end portion of the thin film electrode, the position of the electrode lead-out portion can be freely determined by cutting the conversion film web to allow a portion of the non-adhered portion of the conversion film web to remain in a case where a conversion film is prepared, and thus the conversion film web can be formed in a desired shape. Therefore, the degree of freedom in design is high. Accordingly, various shapes of conversion films can be easily prepared, and productivity can be improved.

[Electroacoustic Transducer]

Next, an electroacoustic transducer using the conversion film prepared in the manufacturing method of the present invention will be described.

Figure 9A:
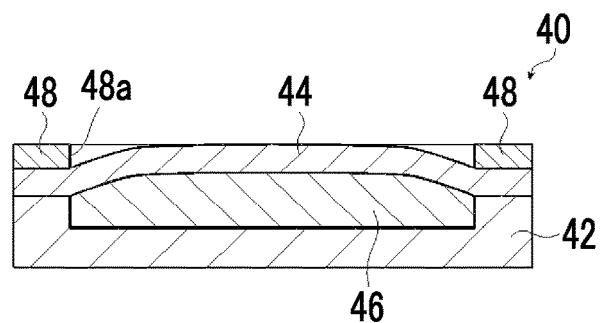
FIG. 9A is a conceptual view illustrating an example of a piezoelectric speaker that uses an electroacoustic conversion film of the present invention.
Figure 9B:
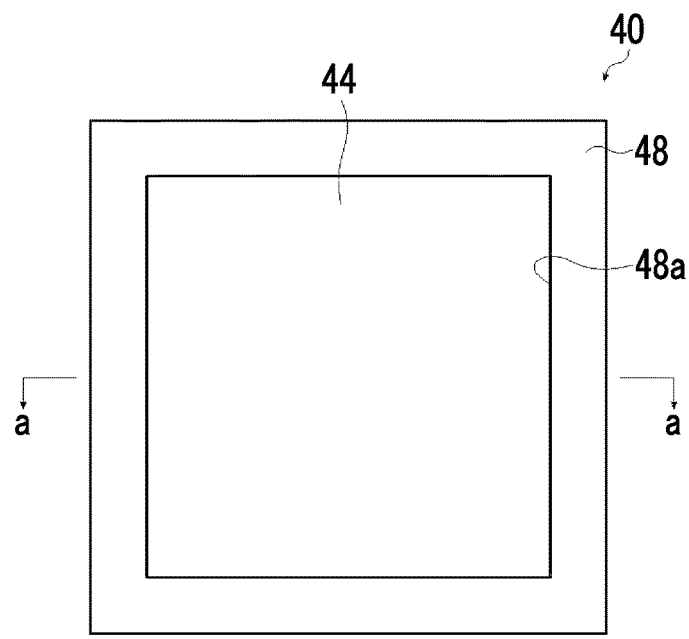
FIG. 9B is a conceptual view illustrating the example of the piezoelectric speaker that uses the electroacoustic conversion film of the present invention.

FIG. 9A is a schematic sectional view illustrating an example of the electroacoustic transducer using the conversion film of the present invention, and FIG. 9B is a plan view of FIG. 9A. That is, FIG. 9A is a sectional view taken along line a-a in FIG. 9B.

An electroacoustic transducer 40 illustrated in FIGS. 9A and 9B is a flat type piezoelectric speaker in which a conversion film 44 of the present invention described above is used as a speaker diaphragm for converting an electrical signal into vibration energy.

The piezoelectric speaker 40 is able to be used as a microphone, a sensor for an instrument, or the like.

The piezoelectric speaker 40 in the illustrated example basically includes the conversion film 44 (piezoelectric film), a case 42, a viscoelastic supporter 46, and a frame 48.

The conversion film 44 is a conversion film formed by cutting the conversion film web of the present invention into a substantially rectangular shape.

The case 42 is a thin housing formed of plastic or the like in a square tubular shape in which one side is open. In the piezoelectric speaker using the conversion film of the present invention, the case 42 (that is, the piezoelectric speaker) is not limited to the square tubular shape, and a housing having various shapes such as a cylindrical shape and a rectangular tubular shape having a rectangular bottom surface is able to be used.

In addition, the frame 48 is a plate material which has an opening at the center and has a shape similar to the upper end surface (open side) of the case 42.

Furthermore, the viscoelastic supporter 46 has moderate viscosity and elasticity, supports the conversion film 44, and applies a constant mechanical bias to any place of the conversion film so as to convert the stretching and contracting movement of the conversion film into a forward and rearward movement (a movement in a direction perpendicular to the surface of a film). As an example, wool felt, nonwoven fabric of wool felt including rayon or PET, a foamed material (foamed plastic) such as glass wool or polyurethane, a laminate of a plurality of sheets of paper, a coating material, and the like are exemplified.

In the illustrated example, the viscoelastic supporter 46 has a quadrangular prism shape having a slightly larger bottom surface shape than the bottom surface of the case 42.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The piezoelectric speaker 40 is configured by accommodating the viscoelastic supporter 46 in the case 42, covering the case 42 and the viscoelastic supporter 46 with the conversion film 44, and in a state in which the periphery of the conversion film 44 is pressed against the upper end surface of the case 42 by the frame 48, fixing the frame 48 to the case 42.

A method of fixing the frame to the case 42 is not particularly limited, and various known methods such as a method using a screw and a bolt nut and a method using a fixing jig are able to be used.

Figure 9C:
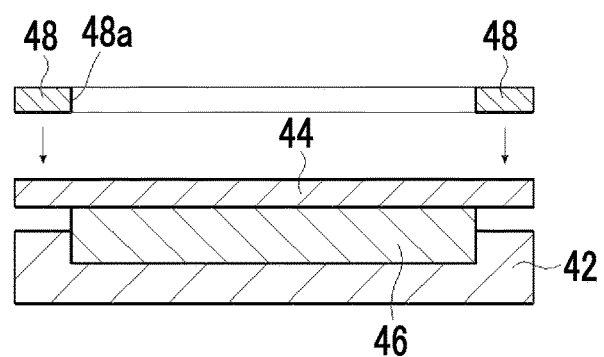
FIG. 9C is a conceptual view illustrating the example of the piezoelectric speaker that uses the electroacoustic conversion film of the present invention.

Here, in the piezoelectric speaker 40, the viscoelastic supporter 46 has a quadrangular prism shape in which the height (thickness) is greater than the height of the inner surface of the case 42. That is, as schematically illustrated in FIG. 9C, in a state before the conversion film 44 and the frame 48 are fixed, the viscoelastic supporter 46 is in a state protruding from the upper surface of the case 42.

Therefore, in the piezoelectric speaker 40, the viscoelastic supporter 46 is held in a state in which the viscoelastic supporter 46 is pressed downward by the conversion film 44 and decreases in thickness toward the peripheral portion of the viscoelastic supporter 46. That is, the principal surface of the conversion film 44 is held in a curved state.

At this time, it is preferable that the entire surface of the viscoelastic supporter 46 is pressed in the surface direction of the conversion film 44 so that the thickness decreases over the entire surface. That is, it is preferable that the entire surface of the conversion film 44 is pressed and supported by the viscoelastic supporter 46.

In the piezoelectric speaker 40 using the conversion film 44 of the present invention, the pressing force of the conversion film 44 exerted on the viscoelastic supporter 46 is not particularly limited, and is preferably about 0.02 to 0.2 MPa in terms of surface pressure at a position where the surface pressure is low.

In the illustrated example, regarding the height difference of the conversion film 44 assembled into the piezoelectric speaker 40, the distance between the point nearest to the bottom surface of the frame 48 and the point furthest from the bottom surface is not particularly limited, and is preferably 1 to 50 mm, and particularly preferably about 5 to 20 mm from viewpoints of obtaining a thin flat speaker and enabling the conversion film 44 to sufficiently perform an upward and downward movement.

In addition, although the thickness of the viscoelastic supporter 46 is not particularly limited, the thickness thereof before pressing is particularly 1 to 100 mm, and particularly preferably 10 to 50 mm.

In the piezoelectric speaker 40, in a case where the conversion film 44 is stretched in the in-plane direction due to the application of a voltage to the piezoelectric layer 12, the conversion film 44 moves upward (in the radial direction of sound) in order to absorb the stretching.

Conversely, in a case where the conversion film 44 is contracted in the in-plane direction due to the application of a voltage to the piezoelectric layer 12, the conversion film 44 moves downward (toward the case 42) in order to absorb the contraction.

The piezoelectric speaker 40 generates a sound by vibrations caused by repetition of stretching and contraction of the conversion film 44.

In the piezoelectric speaker 40, the viscoelastic supporter 46 is in a state of being more compressed in the thickness direction as it approaches the frame 48. However, due to the static viscoelastic effect (stress relaxation), a constant mechanical bias can be maintained at any place of the conversion film 44. Accordingly, the stretching and contracting movement of the conversion film 44 is efficiently converted into a forward and rearward movement, so that it is possible to obtain a flat piezoelectric speaker 40 that is thin, achieves a sufficient sound volume, and has excellent acoustic properties.

Here, in the piezoelectric speaker 40 in the illustrated example, the entire peripheral area of the conversion film 44 is pressed against the case 42 (that is, the viscoelastic supporter 46) by the frame 48, but the present invention is not limited thereto.

That is, the electroacoustic transducer using the conversion film 44 of the present invention is also able to use a configuration in which the conversion film 44 is pressed against and fixed to the surface of the case 42 by screws, bolt nuts, holding devices, or the like, for example, at the four corners of the case 42 without using the frame 48.

An O-ring or the like may be interposed between the case 42 and the conversion film 44. With this configuration, a damper effect is able to be achieved, and it is possible to prevent the vibration of the conversion film 44 from being transmitted to the case 42, and to obtain more excellent acoustic properties.

In addition, the electroacoustic transducer using the conversion film 44 may be configured to include a support plate on which the viscoelastic supporter 46 is placed instead of the case 42 that accommodates the viscoelastic supporter 46.

That is, a configuration in which the viscoelastic supporter 46 is placed on the support plate having stiffness, the conversion film 44 is placed to cover the viscoelastic supporter 46, the same frame 48 as described above is placed on the peripheral portion of the conversion film 44, and the frame 48 is fixed to the support plate by screws or the like to press the viscoelastic supporter 46 against the conversion film 44 together with the frame 48 and bend the conversion film 44 is also able to be used.

Furthermore, even in this configuration that does not have the case 42, the conversion film 44 may be held in a state where the viscoelastic supporter 46 is pressed and thinned by screws or the like without using the frame 48.

A configuration in which the vibration of the conversion film 44 is further amplified by using various vibration plates made of polystyrene, foamed PET, or carbon fiber as the material of the support plate may be adopted.

Moreover, the electroacoustic transducer using the conversion film 44 is not limited to the configuration that presses the periphery, and for example, a configuration in which points other than the periphery of the laminated body of the viscoelastic supporter 46 and the conversion film 44 are pressed by some means and at least a portion of the conversion film 44 is held in a curved state is also able to be used.

Alternatively, a configuration in which a resin film is attached to the conversion film 44 to apply (hold) a tension thereto may also be adopted. By configuring the conversion film to be held with the resin film and causing the conversion film to be held in a curved state, a flexible speaker is able to be obtained.

Alternatively, the conversion film 44 may be configured to be stretched over a curved frame.

In addition, the electroacoustic transducer using the conversion film of the present invention is not limited to the configuration using the viscoelastic supporter 46.

For example, a configuration including an elastic supporter having elasticity instead of the viscoelastic supporter 46 may be provided. As the elastic supporter, natural rubber and various synthetic rubbers are exemplified.

Alternatively, a configuration in which an airtight material having the same shape as that of the case 42 is used as a case, the open end of the case is covered and closed by the conversion film 44, gas is introduced into the case to apply a pressure to the conversion film 44, and the conversion film 44 is thus held in a convexly swollen state may be provided.

In the configuration in which a pressure is applied to the inside, the distortion component increases due to the influence of the air spring, and there is concern that the acoustic quality may deteriorate. On the other hand, in the case of the configuration in which the conversion film 44 is supported by a viscoelastic supporter such as glass wool or felt, since viscosity is imparted, the distortion component does not increase, which is preferable.

In addition, those other than the gas may fill the case, and a magnetic fluid or a coating material is able to be used as long as an appropriate viscosity is able to be imparted.

Furthermore, the combination using the viscoelastic supporter and the configuration in which a pressure is applied to the inside may be combined.

The conversion film 44 itself may be molded in advance into a convex shape or a concave shape. In that time, the entirety of the conversion film 44 may be molded into a convex shape or a concave shape, or a portion of the conversion film 44 may be molded into a convex portion (concave portion). A forming method of the convex portion is not particularly limited, and various known processing methods of resin films are able to be used. For example, the convex portion is able to be formed by a vacuum pressure molding method or a forming method such as embossing.

The electroacoustic conversion film of the present invention is able to be suitably used as a speaker by being assembled with a flexible display such as an organic EL display. Furthermore, since the electroacoustic conversion film of the present invention is thin, the electroacoustic conversion film is able to be suitably assembled with a thin display device such as a liquid crystal display device, an electronic paper, and a screen for a projector.

With such a configuration, it is possible to improve the design properties and entertainment properties of the conversion film. Further, by integrating the conversion film as a speaker with a screen or a display, it is possible to reproduce a sound in a direction in which an image is displayed, and to improve a sense of realism.

In addition, the screen for a projector is flexible and is thus able to be provided with curvature. By causing an image display surface to be provided with curvature, it is possible to make the distance from an observer to the screen substantially uniform between the center and the end portion of the screen, and it is possible to improve a sense of realism.

In the case where the image display surface is provided with curvature as described above, distortion occurs in the projected image. Therefore, it is preferable to perform image processing on the data of the projected image so as to reduce the distortion according to the curvature of the image display surface.

Furthermore, as described above, in the conversion film 44 of the present invention, the piezoelectric layer 12 also has a capability of converting vibration energy into an electrical signal.

Therefore, by using this, the conversion film 44 of the present invention is able to be suitably used also in a microphone or a sensor (pickup) for a musical instrument. For example, since the conversion film 44 of the present invention has flexibility, the conversion film 44 is able to be attached to a throat portion of a person having a complex curved surface, and acts as a vocal cord microphone merely by being attached to the vicinity of the vocal cord.

As described above, the electroacoustic conversion film of the present invention and the manufacturing method thereof are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 4A to 4E and FIGS. 5A to 5C described above, the conversion film web 10 of the present invention illustrated in FIGS. 1A and 1B was prepared.

[Preparation Step]

First, a lower electrode laminated body 11a in which a copper thin film having a thickness of 0.1 μm was vacuum vapor deposited on a PET film having a thickness of 4 μm and a size of 200 mm×350 mm, and an upper electrode laminated body 11c in which a copper thin film having a thickness of 0.1 μm was vacuum vapor deposited on a PET film having a thickness of 4 μm and a size of 180 mm×350 mm were prepared. That is, in this example, the lower thin film electrode 14 and the upper thin film electrode 16 are copper vapor deposition thin films having a thickness of 0.1 μm, and the lower protective layer 18 and the upper protective layer 20 are PET films having a thickness of 4 μm.

In order to obtain good handleability during the process, as the PET film, a film with a separator (temporary supporter PET) having a thickness of 50 μm attached thereto was used, and the separator of each protective layer was removed after the preparation of the conversion film web.

[First Lamination Step A]

Next, cyanoethylated PVA (CR-V manufactured by Shin-Etsu Chemical Co., Ltd.) was dissolved in dimethylformamide (DMF) at the following compositional ratio. Thereafter, PZT particles were added to this solution at the following compositional ratio, and were dispersed by using a propeller mixer (rotation speed 2000 rpm), and thus a coating material A for forming the piezoelectric layer 12 was prepared.

| | |
|---|---|
| PZT Particles | 300 parts by mass |
| Cyanoethylated PVA | 30 parts by mass |
| DMF | 70 parts by mass |

In addition, the PZT particles were obtained by sintering commercially available PZT raw material powder at 1000° C. to 1200° C. and thereafter crushing and classifying the resultant so as to have an average particle diameter of 5 μm.

The piezoelectric layer 12 formed by using the coating material A is a polymer composite piezoelectric body in which the PZT particles as the piezoelectric body particles 26 are dispersed in cyanoethylated PVA as the matrix 24 formed of a polymer material.

The prepared coating material A for forming the piezoelectric layer 12 was applied onto the lower thin film electrode 14 (the copper vapor deposition thin film) of the lower electrode laminated body 11a prepared in advance by using a slide coater. Furthermore, the coating material A was applied such that the film thickness of the coating film after being dried was 40 μm.

Here, the application was performed by setting the width of the slit opening of the slide coater during the application to 180 mm such that the regions of the two opposing edges as the long sides of the lower thin film electrode 14 became coating material non-coated portions.

That is, the width of the coating material non-coated portion serving as the non-adhered portion $C_1$ was set to 10 mm.

Next, a material in which the coating material A was applied onto the lower electrode laminated body 11a was heated and dried on a hot plate at 120° C. such that DMF was evaporated. Accordingly, the laminated body 11b was prepared in which the lower thin film electrode 14 made of copper was formed on the lower protective layer 18 made of PET, and the piezoelectric layer 12 having a thickness of 40 μm was formed thereon.

The piezoelectric layer 12 of the laminated body 11b was subjected to the polarization processing by corona poling illustrated in FIGS. 4C and 4D. Furthermore, the polarization processing was performed by setting the temperature of the piezoelectric layer 12 to 100° C., applying a direct-current voltage of 6 kV between the lower thin film electrode 14 and the corona electrode 30 so as to cause corona discharge to occur.

[Second Lamination Step A]

(Adhesive Application Step)

First, an adhesive (CYANORESIN CR-V manufactured by Shin-Etsu Chemical Co., Ltd.) was applied to the upper thin film electrode 16 side of the upper electrode laminated body 11c.

Here, the application was performed by setting the width of one of application regions during the application of the adhesive to 160 mm such that the regions of the two opposing edges as the long sides of the upper thin film electrode 16 became adhesive non-coated portions.

That is, the width of the adhesive non-coated portion serving as the non-adhered portion $C_2$ was set to 10 mm.

(Bonding Step)

Next, the upper electrode laminated body 11c to which the adhesive was applied was placed on and bonded to the laminated body 11b subjected to the polarization processing while the adhesive side faced the piezoelectric layer 12 such that the conversion film web 10 was prepared.

Thereafter, the wire 36 as the electrode lead-out portion is connected to each of the non-adhered portions $C_1$ of the lower thin film electrode 14 and the non-adhered portions $C_2$ of the upper thin film electrode 16.

Example 2

A conversion film web was prepared in the same manner as in Example 1 except that the second lamination step A was changed to a second lamination step B described below.

[Second Lamination Step B]

The upper electrode laminated body 11c was laminated on the laminated body 11b which was subjected to the polarization processing while the upper thin film electrode 16 faced the piezoelectric layer 12.

Next, the laminated body of the laminated body 11b and the upper electrode laminated body 11c was subjected to thermal compression bonding at 120° C. by using a laminator device, and thus the piezoelectric layer 12 and the upper thin film electrode 16 were adhered to each other.

Here, as illustrated in FIG. 6, by using a heating roller having a narrower width than the upper electrode laminated body during the thermal compression bonding, the non-adhered portions $C_2$ as non-thermal-compression-bonded portions that were not thermal-compression-bonded were formed in the regions of the two opposing edges of the upper electrode laminated body 11c.

Example 3

A conversion film web was prepared in the same manner as in Example 1 except that the second lamination step A was changed to a second lamination step C described below.

[Second Lamination Step C]

The upper electrode laminated body 11c was laminated on the laminated body 11b which was subjected to the polarization processing while the upper thin film electrode 16 faced the piezoelectric layer 12.

Next, as illustrated in FIG. 7A, the mask members 80 were disposed in the regions of the two opposing edges of the upper electrode laminated body 11c between the piezoelectric layer 12 and the upper thin film electrode 16.

As the mask member 80, a film-like material formed of polyimide with a thickness of 15 μm was used.

Next, the laminated body of the laminated body 11b and the upper electrode laminated body 11c was subjected to thermal compression bonding at 120° C. by using the laminator device, and thus the piezoelectric layer 12 and the upper thin film electrode 16 were adhered to each other. Thereafter, the mask members 80 were removed.

The masked region of the upper thin film electrode 16 was not adhered to the piezoelectric layer 12 and became the non-adhered portion $C_2$.

Examples 4 to 6

Conversion film webs were prepared respectively in the same manners as in Examples 1 to 3 except that PVDF not containing piezoelectric body particles was used as the piezoelectric layer and a coating material B described below was used as the coating material for forming the piezoelectric layer.

A coating material containing PVDF and MEK at the following compositional ratio was prepared as the coating material B of the PVDF piezoelectric layer.

| | |
|---|---|
| PVDF | 100 parts by mass |
| MEK | 300 parts by mass |

Examples 7 to 9

Conversion film webs were prepared respectively in the same manners as in Examples 1 to 3 except that a highly dielectric polymer described below was used as the piezoelectric layer and a coating material C described below was used as the coating material for forming the piezoelectric layer.

A coating material containing the highly dielectric polymer at the following compositional ratio was prepared as the coating material C of the piezoelectric layer formed of the highly dielectric polymer.

| | |
|---|---|
| Highly dielectric polymer (CYANORESIN CR-S manufactured by Shin-Etsu Chemical Co., Ltd.) | 100 parts by mass |
| Cyclohexanone | 300 parts by mass |

Comparative Example 1

A conversion film was prepared in the same manner as in Example 1 except that the first lamination step A was changed to a first lamination step B described below, and the second lamination step A was changed to a second lamination step D described below.

[First Lamination Step B]

The coating material A was applied to the entire surface of the lower thin film electrode of the lower electrode laminated body and was thereafter heated and dried on the hot plate at 120° C. such that DMF was evaporated, thereby preparing a laminated body in which the lower thin film electrode was formed on the lower protective layer and the piezoelectric layer having a thickness of 40 μm was formed thereon.

The laminated body was subjected to the polarization processing, and one edge of the laminated body was cut to provide a portion protruding in a convex shape. Furthermore, the piezoelectric layer corresponding to the portion protruding in a convex shape was dissolved and removed (hereinafter, referred to as "film removal") using a cotton swab impregnated with a solvent (acetone) such that an electrode lead-out portion protruding in a convex shape was provided.

[Second Lamination Step D]

One end of the upper electrode laminated body having the same size as the lower electrode laminated body was cut to provide a portion protruding in a convex shape in the surface direction, the upper electrode laminated body was then placed on the laminated body of the lower electrode laminated body and the piezoelectric layer, and the resultant was subjected to thermal compression bonding at 120° C. by using the laminator device such that the piezoelectric layer and the upper thin film electrode were adhered to each other and a conversion film was prepared. The upper electrode laminated body was laminated such that the portion of the upper electrode laminated body protruding in a convex shape (electrode lead-out portion) did not overlap the piezoelectric layer and did not overlap the portion of the lower electrode laminated body protruding in a convex shape.

The wire 36 was connected to each of the electrode lead-out portion of the lower thin film electrode 14 and the electrode lead-out portion of the upper thin film electrode 16.

Comparative Example 2

A conversion film was prepared in the same manner as in Example 1 except that a lamination step E described below was performed instead of the first lamination step A and the second lamination step A.

[Lamination Step E]

The coating material A was applied to the entire surface of the lower thin film electrode of the lower electrode laminated body and was thereafter heated and dried on the hot plate at 120° C. such that DMF was evaporated, thereby preparing a laminated body in which the lower thin film electrode was formed on the lower protective layer and the piezoelectric layer having a thickness of 40 μm was formed thereon.

The laminated body was subjected to the polarization processing, the upper electrode laminated body having the same size as the lower electrode laminated body was placed on the piezoelectric layer, and the resultant was subjected to thermal compression bonding at 120° C. by using the laminator device such that the piezoelectric layer and the upper thin film electrode were adhered to each other.

Next, portions of the lower protective layer and the upper protective layer were dissolved and removed through laser processing to expose portions of the lower thin film electrode and the upper thin film electrode to the surface, thereby preparing a conversion film. The exposed portions were used as electrode lead-out portions.

The wire 36 was connected to each of the electrode lead-out portion of the lower thin film electrode 14 and the electrode lead-out portion of the upper thin film electrode 16.

Comparative Example 3

A conversion film was prepared in the same manner as in Example 1 except that a lamination step F described below was performed instead of the first lamination step A and the second lamination step A.

[Lamination Step F]

The coating material A was applied to the entire surface of the lower thin film electrode of the lower electrode laminated body and was thereafter heated and dried on the hot plate at 120° C. such that DMF was evaporated, thereby preparing a laminated body in which the lower thin film electrode was formed on the lower protective layer and the piezoelectric layer having a thickness of 40 μm was formed thereon.

The laminated body was subjected to the polarization processing, the upper electrode laminated body having the same size as the lower electrode laminated body was placed on the piezoelectric layer, and the resultant was subjected to thermal compression bonding at 120° C. by using the laminator device such that the piezoelectric layer and the upper thin film electrode were adhered to each other.

Next, portions of the lower protective layer and the upper protective layer were cut and removed through machining to expose portions of the lower thin film electrode and the upper thin film electrode to the surface, thereby preparing a conversion film. The exposed portions were used as electrode lead-out portions.

The wire 36 was connected to each of the electrode lead-out portion of the lower thin film electrode 14 and the electrode lead-out portion of the upper thin film electrode 16.

Comparative Example 4

A conversion film was prepared in the same manner as in Example 1 except that a lamination step G described below was performed instead of the first lamination step A and the second lamination step A.

[Lamination Step G]

The coating material A was applied to the entire surface of the lower thin film electrode of the lower electrode laminated body and was thereafter heated and dried on the hot plate at 120° C. such that DMF was evaporated, thereby preparing a laminated body in which the lower thin film electrode was formed on the lower protective layer and the piezoelectric layer having a thickness of 40 μm was formed thereon.

The laminated body was subjected to the polarization processing, the upper electrode laminated body having the same size as the lower electrode laminated body was placed on the piezoelectric layer, and the resultant was subjected to thermal compression bonding at 120° C. by using the laminator device such that the piezoelectric layer and the upper thin film electrode were adhered to each other.

Next, portions of the piezoelectric layer were dissolved and removed from the side surfaces thereof using a cotton swab impregnated with a solvent (acetone) such that electrode lead-out portions were provided.

The wire 36 was connected to each of the electrode lead-out portion of the lower thin film electrode 14 and the electrode lead-out portion of the upper thin film electrode 16.

Comparative Examples 5 to 8

Conversion films were prepared respectively in the same manners as in Comparative Examples 1 to 4 except that the material of the piezoelectric layer was the same as in Example 4.

Comparative Examples 9 to 12

Conversion films were prepared respectively in the same manners as in Comparative Examples 1 to 4 except that the material of the piezoelectric layer was the same as in Example 7.

[Evaluation]

[Number of Operations]

The number of operations was evaluated according to whether or not there was an operation aimed only to form the electrode lead-out portion.

A case where there was the operation aimed only to form the electrode lead-out portion was absent was evaluated as A, and A case where the operation was present was evaluated as B.

[Yield]

The electrostatic capacitance of the prepared conversion film web (conversion film) was measured and the yield was evaluated.

Measurement conditions were set to a measurement frequency of 1 kHz and an execution voltage of 5V, and the electrostatic capacitance was measured in an environment at a temperature of 25° C. and a humidity of 40% to 50%.

Measurement was performed on ten test pieces. A case where the number of test pieces having an electrostatic capacitance of 1.8 to 2.2 µF was 10 was evaluated as A, a case where the number of test pieces having an electrostatic capacitance of 1.8 to 2.2 µF was 9 was evaluated as B, and a case where the number of test pieces having an electrostatic capacitance of 1.8 to 2.2 µF was 8 or less was evaluated as C.

It is thought that the electrode lead-out portion of the conversion film web (conversion film) of which the electrostatic capacitance was outside the range was damaged and connection to the wire had failed.

Evaluation results are shown in Table 1.

laminated, the non-adhered portion serving as the electrode lead-out portions were provided. Therefore, there is no need to provide the operation aimed only to form the electrode lead-out portion, and the number of operations is smaller than in Comparative Examples 1 to 12.

Therefore, costs can be reduced.

In addition, in the conversion film webs prepared in Examples 1 to 9 as the manufacturing methods of the present invention, in the case where the piezoelectric layer and the electrode laminated body were laminated, the non-adhered portion serving as the electrode lead-out portions were provided. Therefore, the yield can be improved compared to Comparative Examples 1 to 12 without damage to the thin film electrode.

From the above results, the effect of the present invention is obvious.

EXPLANATION OF REFERENCES 10, 10b: electroacoustic conversion film web
11a: lower electrode laminated body
11b: laminated body
11c: upper electrode laminated body
12: piezoelectric layer

TABLE 1

| | Piezoelectric layer | Forming method of electrode lead-out portion | | Evaluation | |
| --- | --- | --- | --- | --- | --- |
| | Material | Lower portion | Upper portion | Number of operations | Yield |
| Example 1 | Polymer composite piezoelectric body | Formation of coating material non-coated portion | Formation of adhesive non-coated portion | A | A |
| Example 2 | Polymer composite piezoelectric body | Formation of coating material non-coated portion | Formation of non-adhered portion | A | A |
| Example 3 | Polymer composite piezoelectric body | Formation of coating material non-coated portion | Masking | A | A |
| Example 4 | PVDF | Formation of coating material non-coated portion | Formation of adhesive non-coated portion | A | A |
| Example 5 | PVDF | Formation of coating material non-coated portion | Formation of non-adhered portion | A | A |
| Example 6 | PVDF | Formation of coating material non-coated portion | Masking | A | A |
| Example 7 | Highly dielectric polymer | Formation of coating material non-coated portion | Formation of adhesive non-coated portion | A | A |
| Example 8 | Highly dielectric polymer | Formation of coating material non-coated portion | Formation of non-adhered portion | A | A |
| Example 9 | Highly dielectric polymer | Formation of coating material non-coated portion | Masking | A | A |
| Comparative Example 1 | Polymer composite piezoelectric body | Film removal | Formation of protruding portion | B | B |
| Comparative Example 2 | Polymer composite piezoelectric body | Laser processing | Laser processing | B | B |
| Comparative Example 3 | Polymer composite piezoelectric body | Machining | Machining | B | C |
| Comparative Example 4 | Polymer composite piezoelectric body | Film removal from side surface | Film removal from side surface | B | C |
| Comparative Example 5 | PVDF | Film removal | Formation of protruding portion | B | B |
| Comparative Example 6 | PVDF | Laser processing | Laser processing | B | B |
| Comparative Example 7 | PVDF | Machining | Machining | B | C |
| Comparative Example 8 | PVDF | Film removal from side surface | Film removal from side surface | B | C |
| Comparative Example 9 | Highly dielectric polymer | Film removal | Formation of protruding portion | B | B |
| Comparative Example 10 | Highly dielectric polymer | Laser processing | Laser processing | B | B |
| Comparative Example 11 | Highly dielectric polymer | Machining | Machining | B | C |
| Comparative Example 12 | Highly dielectric polymer | Film removal from side surface | Film removal from side surface | B | C |

From Table 1, in Examples 1 to 9 as the manufacturing methods of the present invention, in the case where the piezoelectric layer and the electrode laminated body were 12a: upper surface
14, 14b: lower thin film electrode
15, 17: adhesive layer
16: upper thin film electrode
18, 18b: lower protective layer
20: upper protective layer
24: matrix
26: piezoelectric body particles
30: corona electrode
32: direct-current power source
36: wire
40: piezoelectric speaker
42: case
44: electroacoustic conversion film
46: elastic supporter
48: frame

What is claimed is:
1. An electroacoustic conversion film comprising:
a piezoelectric layer having dielectric properties;
two thin film electrodes respectively formed on both surfaces of the piezoelectric layer;
two protective layers respectively formed on the two thin film electrodes;
regions in which the piezoelectric layer, the two thin film electrodes, and the two protective layers have the same shape when viewed in a direction perpendicular to a principal surface of the piezoelectric layer and are adhered; and
regions in which the piezoelectric layer, the two thin film electrodes, and the two protective layers overlap when viewed in the direction perpendicular to the principal surface of the piezoelectric layer and the piezoelectric layer and the two thin film electrodes are not adhered.

* * * * *